(12) United States Patent  
Yamazaki et al.

(10) Patent No.: US 11,522,234 B2  
(45) Date of Patent: Dec. 6, 2022

(54) SEMICONDUCTOR DEVICE, BATTERY UNIT, AND BATTERY MODULE

(71) Applicant: SEMICONDUCTOR ENERGY LABORATORY CO., LTD., Atsugi (JP)

(72) Inventors: Shunpei Yamazaki, Tokyo (JP); Koji Kusunoki, Kanagawa (JP); Kazunori Watanabe, Tokyo (JP); Ryota Tajima, Kanagawa (JP); Hideaki Shishido, Kanagawa (JP); Kensuke Yoshizumi, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 332 days.

(21) Appl. No.: 16/640,233

(22) PCT Filed: Aug. 28, 2018

(86) PCT No.: PCT/IB2018/056530  
§ 371 (c)(1),  
(2) Date: Feb. 19, 2020

(87) PCT Pub. No.: WO2019/048981  
PCT Pub. Date: Mar. 14, 2019

(65) Prior Publication Data  
US 2020/0295413 A1 Sep. 17, 2020

(30) Foreign Application Priority Data  
Sep. 6, 2017 (JP) .............................. JP2017-171224

(51) Int. Cl.  
*H01M 10/48* (2006.01)  
*G01R 31/382* (2019.01)  
(Continued)

(52) U.S. Cl.  
CPC .............. *H01M 10/48* (2013.01); *G01K 1/14* (2013.01); *G01R 31/371* (2019.01);  
(Continued)

(58) Field of Classification Search  
None  
See application file for complete search history.

(56) References Cited

U.S. PATENT DOCUMENTS 7,808,206 B2 10/2010 Nagatsuka et al.  
7,911,178 B2 3/2011 Kawata et al.  
(Continued)

FOREIGN PATENT DOCUMENTS

CN 101262141 A 9/2008  
CN 102655337 A 9/2012  
(Continued)

OTHER PUBLICATIONS

International Search Report (Application No. PCT/IB2018/056530) dated Dec. 11, 2018.  
(Continued)

*Primary Examiner* — Roy Y Yi  
(74) *Attorney, Agent, or Firm* — Nixon Peabody LLP; Jeffrey L. Costellia

(57) ABSTRACT

A semiconductor device capable of monitoring the state of a battery or the like is provided. The states of a plurality of batteries in a battery module is easily acquired. The semiconductor device that can be attached to an electrode of a battery or the like includes a first substrate, an element layer, and first to third conductive layers. The element layer includes a first circuit and a second circuit and is provided on a side of a first surface of the first substrate. The first conductive layer and the second conductive layer are provided on a side of a second surface positioned opposite to the first surface of the first substrate. The first circuit is electri-  
(Continued)

cally connected to each of the first conductive layer and the second conductive layer through an opening provided in the first substrate. The third conductive layer is provided to be stacked on a side opposite to the first substrate side of the element layer and electrically connected to the second circuit. The first conductive layer and the second conductive layer each function as a terminal, and the third conductive layer functions as an antenna.

10 Claims, 22 Drawing Sheets

(51) Int. Cl.
*G01R 31/371* (2019.01)
*G01K 1/14* (2021.01)
*G06N 3/04* (2006.01)
*H02J 7/00* (2006.01)
*H01Q 1/22* (2006.01)
*H01Q 1/38* (2006.01)
*H01M 50/20* (2021.01)

(52) U.S. Cl.
CPC ............. *G01R 31/382* (2019.01); *G06N 3/04* (2013.01); *H01M 50/20* (2021.01); *H01Q 1/22* (2013.01); *H01Q 1/38* (2013.01); *H02J 7/00302* (2020.01); *H02J 7/00306* (2020.01)

(56) References Cited

U.S. PATENT DOCUMENTS

| | | | |
|---|---|---|---|
| 7,965,180 B2 | 6/2011 | Koyama | |
| 8,044,800 B2 | 10/2011 | Osada | |
| 8,193,763 B2 | 6/2012 | Kawata et al. | |
| 8,339,096 B2 | 12/2012 | Osada | |
| 8,467,825 B2 | 6/2013 | Kato et al. | |
| 8,587,479 B2 | 11/2013 | Kurokawa | |
| 8,648,439 B2 | 2/2014 | Dozen et al. | |
| 8,811,901 B2 | 8/2014 | Shionoirl et al. | |
| 8,854,191 B2 | 10/2014 | Yamazaki et al. | |
| 8,901,777 B2 | 12/2014 | Kamata et al. | |
| 9,143,011 B2 | 9/2015 | Kamata | |
| 9,270,124 B2 | 2/2016 | Kamata | |
| 9,391,369 B2* | 7/2016 | Miura | H01Q 1/242 |
| 9,391,476 B2 | 7/2016 | Kamata et al. | |
| 9,461,476 B2 | 10/2016 | Kamata | |
| 9,496,743 B2 | 11/2016 | Kamata | |
| 9,502,920 B2 | 11/2016 | Kamata | |
| 9,710,033 B2 | 7/2017 | Yamazaki et al. | |
| 10,168,801 B2 | 1/2019 | Osada et al. | |
| 10,290,908 B2 | 5/2019 | Momo et al. | |
| 2006/0267769 A1 | 11/2006 | Ito et al. | |
| 2008/0177353 A1 | 7/2008 | Hirota et al. | |
| 2008/0219337 A1 | 9/2008 | Kawata et al. | |
| 2008/0234956 A1 | 9/2008 | Mizuno et al. | |
| 2011/0187326 A1 | 8/2011 | Kawata et al. | |
| 2014/0184165 A1* | 7/2014 | Takahashi | H01M 10/486 |
| | | | 429/90 |
| 2015/0048519 A1 | 2/2015 | Park et al. | |
| 2017/0374746 A1 | 12/2017 | Takeya et al. | |
| 2019/0313535 A1 | 10/2019 | Takeya et al. | |

FOREIGN PATENT DOCUMENTS

| | | |
|---|---|---|
| CN | 107211548 A | 9/2017 |
| EP | 1967408 A | 9/2008 |
| EP | 3258752 A | 12/2017 |
| JP | 2002-008731 A | 1/2002 |
| JP | 2005-019649 A | 1/2005 |
| JP | 2006-309738 A | 11/2006 |
| JP | 2007-122690 A | 5/2007 |
| JP | 2008-220074 A | 9/2008 |
| JP | 2008-232758 A | 10/2008 |
| JP | 2014-206499 A | 10/2014 |
| JP | 2016-540389 | 12/2016 |
| JP | 2017-022928 A | 1/2017 |
| WO | WO-2016/129705 | 8/2016 |

OTHER PUBLICATIONS

Written Opinion (Application No. PCT/IB2018/056530) dated Dec. 11, 2018.

* cited by examiner

FIG. 3A1
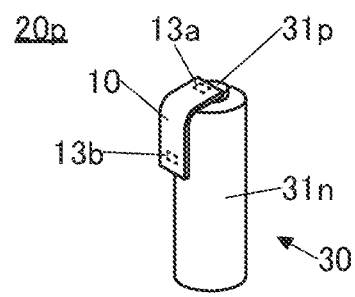
FIG. 3A2
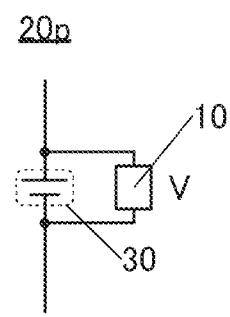
FIG. 3B1
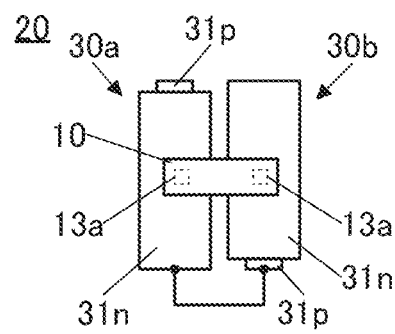
FIG. 3B2
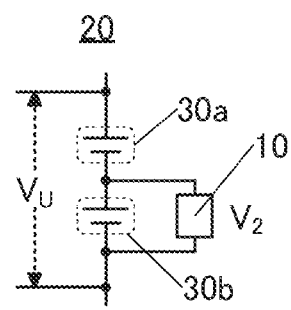
FIG. 3C1
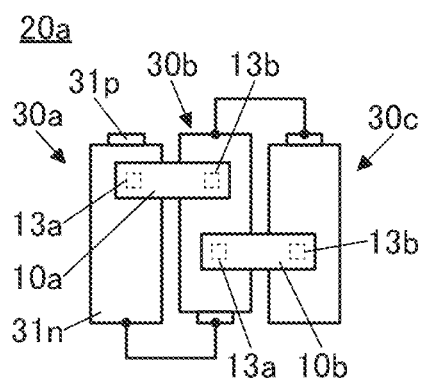
FIG. 3C2
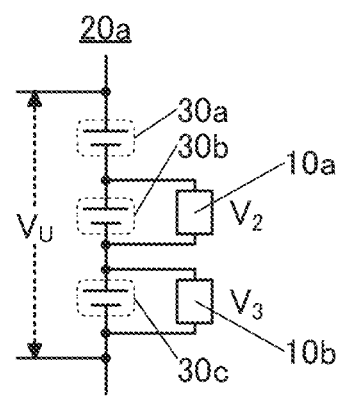
FIG. 3D1
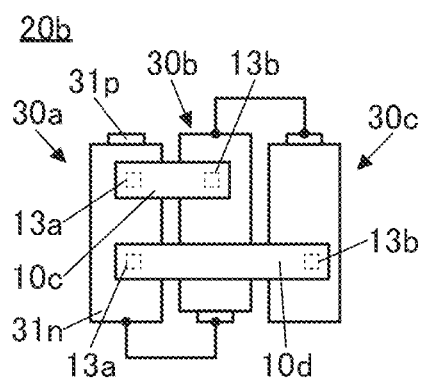
FIG. 3D2
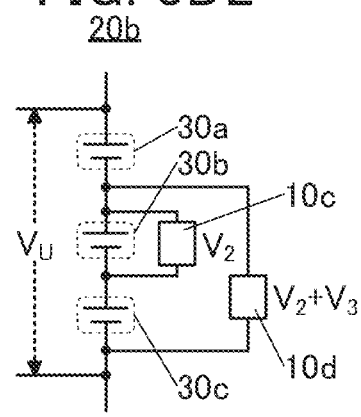

20M

20M

SEMICONDUCTOR DEVICE, BATTERY UNIT, AND BATTERY MODULE

TECHNICAL FIELD

One embodiment of the present invention relates to a semiconductor device. One embodiment of the present invention relates to a battery unit or a battery module including a battery. One embodiment of the present invention relates to a method for controlling a battery.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (including a thin film solar cell, an organic thin film solar cell, and the like), and an electronic device may include a semiconductor device.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry. The lithium-ion secondary batteries are essential as rechargeable energy supply sources for today's information society. Such lithium-ion secondary batteries are used for portable information terminals such as mobile phones, smartphones, tablets, and laptop computers; portable music players; digital cameras; medical equipment; next-generation clean energy vehicles such as hybrid electric vehicles (HEVs), electric vehicles (EVs), and plug-in hybrid electric vehicles (PHEVs); and the like.

In portable information terminals, electric vehicles, and the like, battery modules (also referred to as battery packs or assembled batteries) each including a protection circuit and a plurality of secondary batteries connected in series or in parallel are used in many cases. A battery module means a module in which a plurality of secondary batteries are stored together with a predetermined circuit in a container (e.g., a metal can or a film exterior body), for easy handling of the secondary batteries. The battery module is provided with an ECU (Electronic Control Unit) in order to manage the operation state.

When there are variations in the characteristics of the plurality of secondary batteries included in the battery module, some of the secondary batteries are overcharged in charging, and some of the secondary batteries are not fully charged, and the apparent capacity is reduced as a whole.

In one battery module, a plurality of secondary batteries are collectively charged or discharged; therefore, in the case where the deterioration rates of the secondary batteries are different, variations in characteristics are increased. Accordingly, such a battery module has a vicious circle in which the lifetime becomes shorter by repeated charging and discharging.

Patent Document 1 discloses that charging and discharging from a battery cell to be discharged to a battery cell to be charged are controlled by control of the conduction states of transistors in accordance with the capacity of the battery cells.

PRIOR ART DOCUMENT

Patent Document

[Patent Document 1] Japanese Published Patent Application No. 2017-22928

SUMMARY OF THE INVENTION

Problems to be Solved by the Invention

In many cases, a control circuit of an ECU or the like provided in a battery module is mounted on a printed circuit board and connected to a plurality of secondary batteries with wirings. For the connection between the secondary batteries and the wirings, a method such as wire bonding, welding, or screwing, is used in many cases. Therefore, as the number of the secondary batteries in one battery module is increased, the number of contacts is increased, resulting in an increase in the mounting cost. Moreover, in order to prevent disconnection between the wirings and the secondary batteries due to external environment such as the vibration or the operating temperature, the contacts are required to have high strength.

One object of one embodiment of the present invention is to provide a semiconductor device capable of monitoring the state of a battery or the like. Another object is to provide a semiconductor device capable of outputting data on the state of a battery or the like with high reliability. Another object is to reduce the mounting cost or reduce the number of mounting steps of a battery module. Another object is to easily acquire the states of a plurality of batteries in a battery module. Another object is to provide a lightweight battery module.

Another object of one embodiment of the present invention is to provide a novel semiconductor device, a novel battery unit, or a novel battery module. Another object is to provide a highly reliable semiconductor device, a highly reliable battery unit, or a highly reliable battery module.

Note that the descriptions of these objects do not disturb the existence of other objects. One embodiment of the present invention does not need to achieve all of these objects. Note that objects other than them can be derived from the descriptions of the specification, the drawings, the claims, and the like.

Means for Solving the Problems

One embodiment of the present invention is a semiconductor device including a first substrate, an element layer, a first conductive layer, a second conductive layer, and a third conductive layer. The element layer includes a first circuit and a second circuit and is provided on a side of a first surface of the first substrate. The first conductive layer and the second conductive layer are each provided on a side of a second surface positioned opposite to the first surface of the first substrate. The first circuit is electrically connected to each of the first conductive layer and the second conductive layer through an opening provided in the first substrate. The third conductive layer is provided to be stacked on a side opposite to the first substrate side of the element layer and electrically connected to the second circuit. The first conductive layer and the second conductive layer each function as a terminal, and the third conductive layer functions as an antenna.

In the above, the second circuit preferably has a function of performing wireless communication via the third conductive layer.

In the above, the first circuit preferably has at least one of a function of sensing a voltage between the first conductive layer and the second conductive layer, a function of sensing a current flowing between the first conductive layer and the second conductive layer, and a function of sensing a temperature.

In the above, the first substrate preferably has flexibility.

In the above, a second substrate facing the first substrate is preferably included with the element layer and the third conductive layer therebetween. In this case, the second substrate preferably has flexibility.

Another embodiment of the present invention is a battery unit including any of the above semiconductor devices and a battery. In this case, the first conductive layer of the semiconductor device is in contact with a positive electrode terminal of the battery, and the second conductive layer is in contact with a negative electrode terminal of the battery.

Another embodiment of the present invention is a battery unit including any of the above semiconductor devices and a plurality of batteries. The plurality of batteries are connected in series. The first conductive layer of the semiconductor device is electrically connected to a positive electrode terminal or a negative electrode terminal of one of the batteries, and the second conductive layer is electrically connected to a positive electrode terminal or a negative electrode terminal of another of the batteries.

In the above, each of the plurality of batteries is preferably a cylindrical battery. In this case, the first conductive layer and the second conductive layer of the semiconductor device are preferably provided in contact with side surfaces of cylindrical exterior bodies of the respective batteries.

Another embodiment of the present invention is a battery module including a plurality of the battery units described in any of the above embodiments, a control device, and an exterior body. The plurality of battery units and the control device are provided in the exterior body. The control device includes an antenna, a wireless communication portion, and a control portion. The control portion has a function of performing wireless communication with the plurality of battery units via the wireless communication portion and the antenna. The control portion preferably includes a neural network.

Effect of the Invention

According to one embodiment of the present invention, a semiconductor device capable of monitoring the state of a battery can be provided. A semiconductor device capable of outputting data on the state of a battery with high reliability can be provided. The mounting cost or the number of mounting steps of a battery module can be reduced. The states of a plurality of batteries in a battery module can be easily acquired.

Another embodiment of the present invention can provide a novel semiconductor device, a novel battery unit, or a novel battery module. A highly reliable semiconductor device, a highly reliable battery unit, or a highly reliable battery module can be provided.

Note that the descriptions of the effects do not disturb the existence of other effects. Note that one embodiment of the present invention does not necessarily have all the effects listed above. Effects other than them can be derived from the descriptions of the specification, the drawings, the claims, and the like.

BRIEF DESCRIPTION OF THE DRAWINGS

FIG. 3 Structure examples of a battery unit.

MODE FOR CARRYING OUT THE INVENTION

Figure 1A:
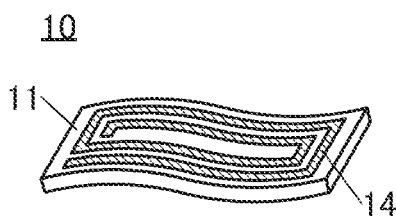
FIG. 1 A structure example of a semiconductor device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

A transistor is a kind of semiconductor elements and can achieve amplification of current or voltage, switching operation for controlling conduction or non-conduction, or the like. An IGFET (Insulated Gate Field Effect Transistor) and a thin film transistor (TFT) are in the category of a transistor in this specification.

Embodiment 1

In this embodiment, a semiconductor device, a battery unit, a battery module, and the like of one embodiment of the present invention will be described with reference to drawings.

A semiconductor device described below as an example has a function of sensing a voltage, a current, a temperature, or the like of a battery and outputting the data thereof by wireless communication. Therefore, the semiconductor device described below as an example can also be referred to as a data processing device, a data communication device, a wireless tag, or the like.

The semiconductor device of one embodiment of the present invention includes an element layer including a first circuit functioning as a circuit that senses a voltage, a current, a temperature, or the like and a second circuit that performs wireless communication. At least one transistor is provided in the element layer. The element layer is formed over a substrate (also referred to as a first substrate).

Furthermore, the semiconductor device includes a pair of conductive layers (also referred to as a first conductive layer and a second conductive layer) each functioning as a terminal portion, on a rear surface side (on a side opposite to the element layer) of the substrate. The terminal portion can also be referred to as an external connection terminal and can be used as a terminal for connection to an electrode of a battery or the like, for example. Each of the conductive layers is electrically connected to the first circuit in the element layer through an opening provided in the substrate.

In the semiconductor device, a conductive layer (also referred to as a third conductive layer) functioning as an antenna is provided over the element layer. The conductive layer is electrically connected to the second circuit. The second circuit can perform wireless communication with the outside via the antenna.

Note that the conductive layer forming the antenna and the conductive layer forming the terminal portion may be interchanged. In other words, the conductive layer provided over the element layer may be used as the terminal portion, and the conductive layer provided on the rear surface side of the substrate may be used as the antenna. In this case, the conductive layer of the terminal portion is connected to the first circuit, and the conductive layer of the antenna is connected to the second circuit through the opening provided in the substrate.

When the pair of terminal portions are respectively connected to a positive electrode terminal and a negative electrode terminal of a battery, for example, the semiconductor device having such a structure can sense a voltage or a current of the battery and transmit the data thereof to a control circuit provided outside by wireless communication. In the case where the first circuit has a function of sensing a temperature, the semiconductor device is attached to the battery or provided in the vicinity of the battery, whereby the data on the temperature of the battery or the vicinity thereof can be transmitted to an external control device by wireless communication. The semiconductor device may have a function of controlling charging and discharging of the battery in response to an instruction transmitted from the control device.

Here, a flexible substrate is preferably used as a substrate over which the element layer is formed. Thus, a bendable semiconductor device can be obtained. Accordingly, the degree of freedom in the shape of a member of a battery or the like to which the semiconductor device is connected can be increased, and the semiconductor device can be attached onto surfaces having a variety of shapes. Moreover, the semiconductor device can be made much lighter in the case of using a flexible substrate than in the case of using a glass substrate or a semiconductor substrate; therefore, in the case where the semiconductor device is used for a battery, for example, an increase in weight due to attachment of the semiconductor device can be inhibited.

Here, a unit structure where the semiconductor device is connected to one or more batteries can be referred to as a battery unit. According to one embodiment of the present invention, data on a voltage, a current, a temperature or the like of an individual battery can be acquired for each battery unit and output to an external control device wirelessly.

The external control device can have a structure including an antenna and a printed circuit board provided with a circuit functioning as a control portion and a circuit functioning as a wireless communication portion. A structure including the control device and a plurality of battery units in an exterior body can be referred to as a battery module. The battery module can be incorporated into a variety of electronic devices, automobiles, large-sized stationary power storage devices used for household equipment, and the like.

The plurality of battery units are provided in the battery module, whereby in the case where abnormality is sensed in one battery unit, replacement per battery unit is possible. Accordingly, a battery can be changed more easily and the maintenance cost can significantly be reduced compared with the case where a voltage, a current, a temperature, or the like is managed for each battery module.

By using a neural network in the control portion included in the control device, sensing of abnormality of a battery, derivation of an optimal control method, or the like can be carried out by inference through the use of the neural network.

Here, in the case where a plurality of batteries and the control circuit are connected to each other with a wiring in the battery module, reconnection of the wiring is needed when the battery having abnormality is replaced; therefore, the whole battery module needs to be replaced. However, in one embodiment of the present invention, the battery unit and the control circuit perform communication wirelessly, and thus replacement in a battery unit is possible. Furthermore, replacement on the user side is easy, so that the storage cost can be further reduced.

A more specific example will be described below with reference to drawings.

[Structure Example of Semiconductor Device]

Figure 1B:
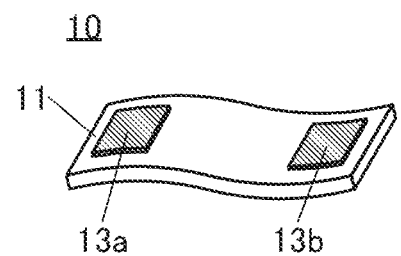
Figure 1C:
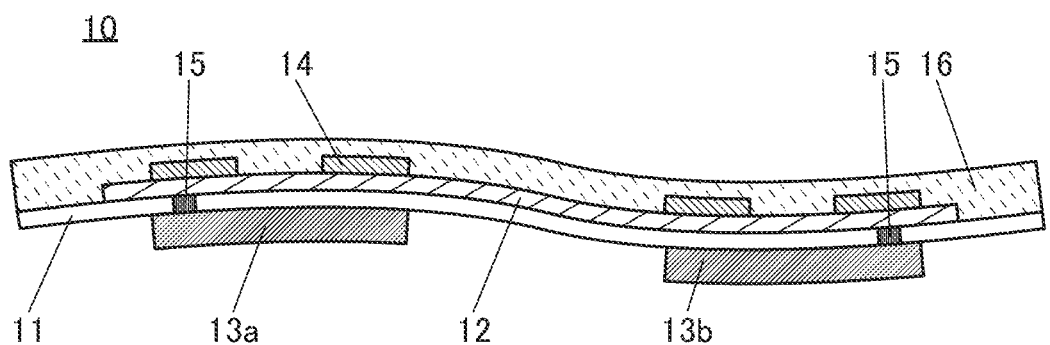

FIGS. 1(A) and 1(B) illustrate an example of an external view of a semiconductor device 10 described below as an example. FIG. 1(A) is a perspective view of the semiconductor device 10, and FIG. 1(B) is a schematic perspective view when the semiconductor device 10 is seen from the rear surface side of FIG. 1(A). FIG. 1(C) shows a schematic cross-sectional view of the semiconductor device 10.

As illustrated in FIGS. 1(A) and 1(B), the semiconductor device 10 has a sheet-like shape and includes an antenna 14 on one surface side and includes a terminal 13a and a terminal 13b on the other surface side.

As illustrated in FIG. 1(C), the semiconductor device 10 includes a substrate 11, an element layer 12, the terminal 13a, the terminal 13b, and the antenna 14. The element layer 12 is provided over the substrate 11 and includes the first circuit and the second circuit to be described later. The antenna 14 is provided over the element layer 12. The terminal 13a and the terminal 13b are provided over a surface of the substrate 11 opposite to the element layer 12. The element layer 12 and each of the terminal 13a and the terminal 13b are electrically connected to each other by a connection portion 15 positioned in an opening provided in the substrate 11.

A protective layer 16 may be provided to cover the antenna 14 and the element layer 12.

Figure 2:
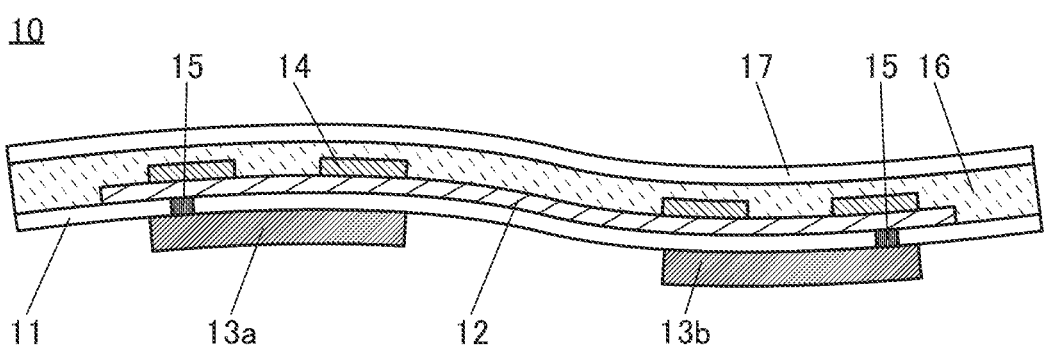
FIG. 2 A structure example of a semiconductor device.

As illustrated in FIG. 2, a substrate 17 may be provided to cover the antenna 14 and the element layer 12. At this time, the protective layer 16 can be used as an adhesive layer.

For the substrate 11 (and the substrate 17), a flexible material is preferably used. For example, a film-like substrate containing an organic resin can be used. Alternatively, a glass substrate or a metal substrate thin enough to have flexibility may be used. Note that in the case where a portion of a sensing target to which the semiconductor device 10 is attached has a flat surface, a substrate material having poor flexibility may be used.

The semiconductor device 10 has two functions, i.e., a function of a monitor device that electrically monitors the state of the sensing target by connection of the terminal 13a and the terminal 13b to an electrode or the like of the sensing target and a function of a data communication device that wirelessly transmits data acquired by the monitoring to an external device via the antenna 14. In addition, the semiconductor device 10 may have a function of a control device that controls the operation of the sensing target in response to an instruction transmitted wirelessly from the external device.

Here, an example of the case where the semiconductor device 10 is used for a battery as an example of the sensing target will be described. The semiconductor device 10 can sense the state of the battery and output the data thereof to the outside. Note that an example of the sensing target is not limited to the battery, and the semiconductor device 10 can be used for all objects such as a variety of electronic devices, non-electronic devices, parts, members, apparatus, buildings, and vehicles and can be used for management or control of their states. Furthermore, attachment of the semiconductor device 10 to human bodies enables the semiconductor device 10 to be used as a device that obtains a variety of biological data such as a body temperature, a pulse rate, a bloodstream, and a blood oxygen level and outputs the data to an external device.

[Structure Examples of Battery Unit]

Examples of a battery unit formed by combining a battery and the semiconductor device 10 will be described below. Here, for simplicity, the case where the semiconductor device 10 has a function of monitoring the voltage of the battery will be described.

FIG. 3(A1) illustrates an example of a battery unit 20p including one battery 30 and one semiconductor device 10.

The battery 30 included in the battery unit 20p is a cylindrical battery and includes a cylindrical negative electrode terminal 31n and a projected positive electrode terminal 31p. The negative electrode terminal 31n functions as an exterior body.

One terminal 13a of the semiconductor device 10 is fixed to be in contact with the positive electrode terminal 31p, and the other terminal 13b of the semiconductor device 10 is fixed to be in contact with a side surface of the exterior body that is the negative electrode terminal 31n. The terminals of the semiconductor device 10 and the terminals of the battery 30 are bonded with a conductive tape, a conductive adhesive, a conductive paste, or the like. A method for fixing the semiconductor device 10 to the battery 30 is not particularly limited, and they may be bonded to each other with a sticky tape, an adhesive tape, a double-sided tape, or the like, or an insulating exterior film may be wound around the outsides of the semiconductor device 10 and the battery 30.

FIG. 3(A2) illustrates an equivalent circuit of the battery unit 20p. The semiconductor device 10 is connected to the battery 30 in parallel and can monitor a voltage V between a positive electrode and a negative electrode of the battery 30.

FIG. 3(B1) illustrates an example of a battery unit 20 including two batteries (a battery 30a and a battery 30b) and one semiconductor device 10.

The battery 30a and the battery 30b are connected in series. The semiconductor device 10 is fixed so as to get across the exterior bodies of the two batteries. The terminal 13a that is one of the terminals of the semiconductor device 10 is connected to the negative electrode terminal 31n of the battery 30a, and the terminal 13b that is the other of the terminals is connected to the negative electrode terminal 31n of the battery 30b.

FIG. 3(B2) illustrates an equivalent circuit of the battery unit 20. The semiconductor device 10 is connected in parallel to the battery 30b positioned on the negative side of the two batteries and can monitor a voltage $V_2$ of the battery 30b. Here, a voltage of the battery 30a (also referred to as a voltage $V_1$) can be estimated by subtracting the voltage $V_2$ from a voltage $V_U$ of the two batteries connected in series. Thus, the state of the voltage of each of the battery 30a and the battery 30b can be monitored by one semiconductor device 10.

FIG. 3(C1) illustrates an example of a battery unit 20a including three batteries (the battery 30a, the battery 30b, and a battery 30c) and two semiconductor devices (a semiconductor device 10a and a semiconductor device 10b).

The battery 30a, the battery 30b, and the battery 30c are connected in series in this order. The semiconductor device 10a is fixed to get across the exterior body of each of the battery 30a and the battery 30b, and the semiconductor device 10b is fixed to get across the exterior body of each of the battery 30b and the battery 30c.

Furthermore, the terminal 13a of the semiconductor device 10a is connected to the negative electrode terminal 31n of the battery 30a, and the terminal 13b of the semiconductor device 10a is connected to the negative electrode terminal 31n of the battery 30b. The terminal 13a of the semiconductor device 10b is connected to the negative electrode terminal 31n of the battery 30b and the terminal 13b of the semiconductor device 10b is connected to the negative electrode terminal 31n of the battery 30c.

FIG. 3(C2) illustrates an equivalent circuit of the battery unit 20a. The semiconductor device 10a is connected to the battery 30b in parallel and can monitor the voltage $V_2$ of the battery 30b. Meanwhile, the semiconductor device 10b is connected to the battery 30c in parallel and can monitor a voltage $V_3$ of the battery 30l Here, the voltage of the battery 30a (the voltage $V_1$) can be estimated by subtracting the voltage $V_2$ and the voltage $V_3$ from the voltage $V_U$ of the three batteries connected in series.

FIG. 3(D1) illustrates a battery unit 20b including three batteries connected in a different way from batteries in the battery unit 20a. The battery unit 20b includes a semiconductor device 10c and a semiconductor device 10d.

The semiconductor device 10c is fixed to get across the exterior body of each of the battery 30a and the battery 30b. Meanwhile, the semiconductor device 10d is fixed to get across the exterior body of each of the battery 30a, the battery 30b, and the battery 30c.

The terminal 13a of the semiconductor device 10c is connected to the negative electrode terminal 31n of the battery 30a, and the terminal 13b of the semiconductor device 10c is connected to the negative electrode terminal 31n of the battery 30b. The terminal 13a of the semiconductor device 10d is connected to the negative electrode terminal 31n of the battery 30a, and the terminal 13b of the semiconductor device 10d is connected to the negative electrode terminal 31n of the battery 30c.

FIG. 3(D2) illustrates an equivalent circuit of the battery unit 20b. The semiconductor device 10c is connected to the battery 30b in parallel and can monitor the voltage $V_2$ of the battery 30b. Meanwhile, the semiconductor device 10d is connected in parallel to the battery 30b and the battery 30c connected in series and can monitor the sum of the voltage $V_2$ of the battery 30b and the voltage $V_3$ of the battery 30c ($V_2+V_3$). The voltage $V_3$ of the battery 30c can be estimated by subtracting the voltage $V_2$ monitored by the semiconductor device 10c from the voltage ($V_2+V_3$) monitored by the semiconductor device 10d. Furthermore, the voltage of the battery 30a (the voltage $V_1$) can be estimated by subtracting the voltage ($V_2+V_3$) monitored by the semiconductor device 10d from the voltage $V_U$ of the three batteries connected in series.

The battery units described here can monitor the voltage of each battery using the semiconductor device and output the voltage to the outside by wireless communication. Therefore, even in a battery module including a plurality of battery units, the state of each battery can be managed. Furthermore, a battery in which abnormality occurs can be specified, and thus replacement in each battery unit is possible, and the cost for maintenance of the battery module can be reduced.

[Structure Example 1 of Battery Module]

A structure example of a battery module including the semiconductor device of one embodiment of the present invention, a battery, and a control device that controls them will be described below.

Figure 4A:
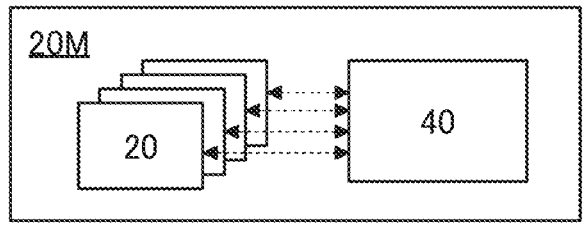
FIG. 4 Structure examples of a battery module.

FIG. 4(A) is a block diagram illustrating a structure of a battery module 20M. The battery module 20M includes the plurality of battery units 20 and a control device 40. The control device 40 can perform individual wireless communication with the battery units 20.

Figure 4B:
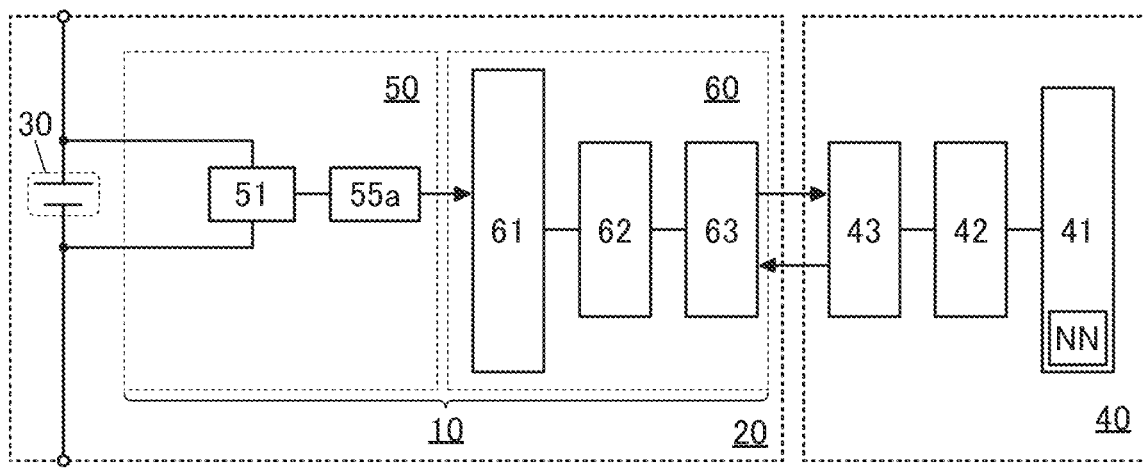

FIG. 4(B) is a specific block diagram of the battery module 20M. Here, for simplicity, in the block diagram, one control device 40 and one battery unit 20 including one semiconductor device 10 and one battery 30 are illustrated.

The semiconductor device 10 includes a first circuit 50 and a second circuit 60. The first circuit 50 includes a voltage sensing circuit 51 and an A-D converter circuit 55a. The second circuit 60 includes a control portion 61, a wireless communication portion 62, and an antenna 63.

The voltage sensing circuit 51 is a circuit that senses the voltage of the battery 30 and outputs a sensing signal as an analog signal to the A-D converter circuit 55a. The A-D converter circuit 55a converts the input analog signal into a digital signal and outputs the digital signal to the control portion 61 of the second circuit 60.

The control portion 61 includes a circuit for analyzing and processing the input signal. The control portion 61 can have a structure including an arithmetic circuit, a logic circuit, a memory circuit, and the like, for example. The identification number (ID) of the semiconductor device 10 may be stored in the memory circuit included in the control portion 61.

The wireless communication portion 62 has a function of demodulating a signal input from the control device 40 through the antenna 63 and generating a demodulation signal and a function of modulating a signal input from the control portion 61 and generating a signal output to the antenna 63. The wireless communication portion 62 can have a structure including analog circuits such as a rectifier circuit, a demodulation circuit, a modulation circuit, an A-D converter circuit, and a D-A converter circuit, for example.

The control portion 61 controls the first circuit 50 such that the first circuit 50 acquires data on the voltage of the battery 30 in response to an instruction from the control device 40. In addition, the control portion 61 can generate a signal including data on a voltage input from the first circuit 50 to output the signal to the wireless communication portion 62.

The control device 40 includes a control portion 41, a wireless communication portion 42, and an antenna 43. The wireless communication portion 42 has a structure similar to that of the wireless communication portion 62.

The control portion 41 can be provided with, for example, a control circuit for achieving a battery management unit (BMU) that performs monitoring of overcharge and overdischarge, monitoring of overcurrent, management of the deterioration state of the battery, calculation of SOC (State Of Charge: remaining capacity rate), control of detection of a failure, and the like, on the basis of data input from the battery unit 20.

The control portion 41 may include, as a control circuit, a memory circuit, an arithmetic circuit such as a CPU or a GPU, or the like in addition to the above. It is particularly preferable to include a product-sum operation circuit including a transistor using an oxide semiconductor.

The control portion 41 may include a neural network NN. By performing inference using the neural network NN on the basis of data input from the plurality of battery units 20, the accuracy of sensing abnormality of the battery unit 20 or the battery 30 included therein can be increased, for example.

In the case where analog data is used as data input to the control portion 41, the neural network NN preferably has a function of performing an analog operation. For example, it is preferable that the neural network NN include a product-sum operation circuit and that the product-sum operation circuit have a function of performing an analog operation. In the case where the neural network NN has a function of performing an analog operation, the area of a circuit forming the neural network NN can be reduced in some cases. For example, an analog-digital converter circuit (A-D converter circuit) becomes unnecessary, so that the circuit area of the control device 40 can be reduced in some cases.

Although not illustrated, it is preferable that the control device 40 be connected to a positive electrode terminal and a negative electrode terminal of each of the battery units 20 and have a function of controlling charge and discharge of each of the battery units.

Here, a power supply voltage for driving the semiconductor device 10 may be supplied from the battery 30 to which the semiconductor device is connected. Alternatively, a structure may be employed in which the power supply voltage is generated from a carrier wave of a wireless signal input from the control device 40. In that case, the second circuit 60 can have a structure including a rectifier circuit, a regulator circuit (a constant-voltage circuit), a reset circuit, and the like.

Figure 4C:
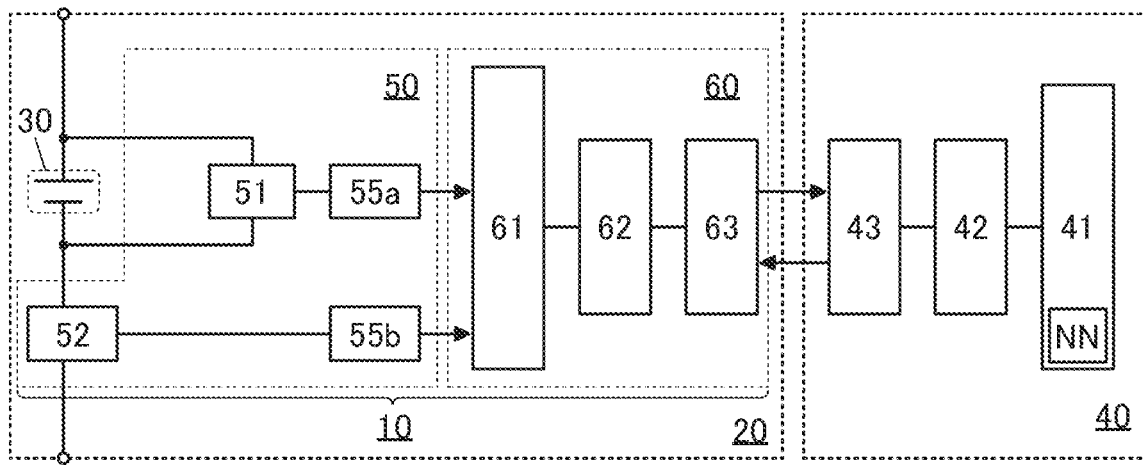

FIG. 4(C) illustrates an example in which the first circuit 50 further includes a current sensing circuit 52 and an A-D converter circuit 55b. The current sensing circuit 52 has a function of sensing a current flowing through the battery 30 and outputting the data thereof to the A-D converter circuit 55b as an analog signal.

Figure 5A:
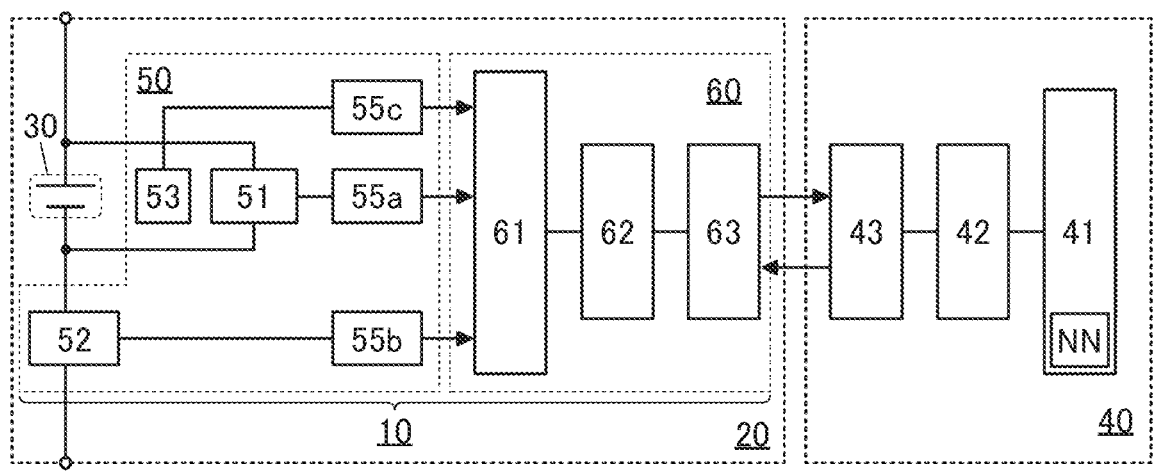
FIG. 5 Structure examples of a battery module.

FIG. 5(A) illustrates an example in which the first circuit 50 further includes a temperature sensor 53 and an A-D converter circuit 55c. The temperature sensor 53 is provided in contact with the battery 30 or in the vicinity thereof, whereby the control device 40 can acquire temperature data of the individual battery units 20.

Figure 5B:
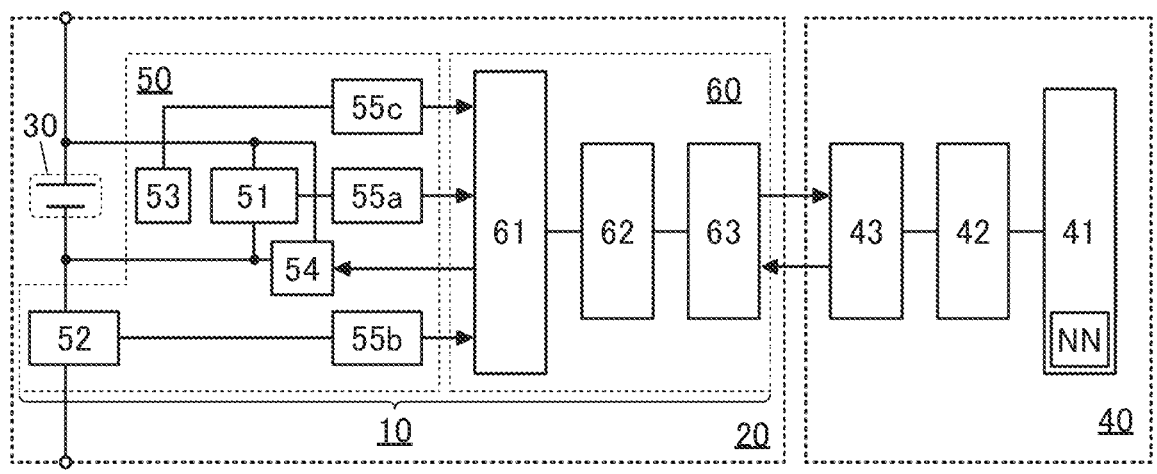

FIG. 5(B) illustrates an example in which the first circuit 50 further includes a balance circuit 54. The balance circuit 54 transmits and receives charges between the plurality of batteries 30 and controls the balance of the remaining power of the batteries 30. In the case where there is a difference in the remaining power between the plurality of batteries 30 in one battery unit 20 because of a variation in the battery characteristics, for example, the balance circuit 54 can perform charging and discharging between the plurality of batteries 30 to make the remaining power equal. For example, the control device 40 can transmit, to the battery unit 20, an instruction to drive the balance circuit 54 on the basis of input data on the voltage or the like of each of the batteries 30.

Although the first circuit 50 has a structure of outputting a digital signal to the control portion 61 from the A-D converter circuit 55a or the like in the above, the first circuit 50 does not need to be provided with the A-D converter circuits in the case where the control portion 61 has a function of processing an analog signal.

[Structure Example 2 of Battery Module]

More specific structure examples of a battery module will be described below.

[Structure Example 1]

Figure 6A:
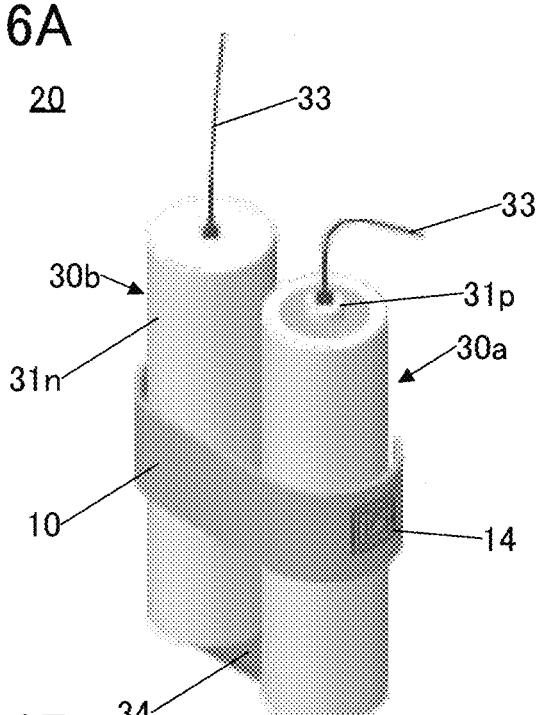
FIG. 6 Structure examples of a battery unit and a battery module.
Figure 6B:
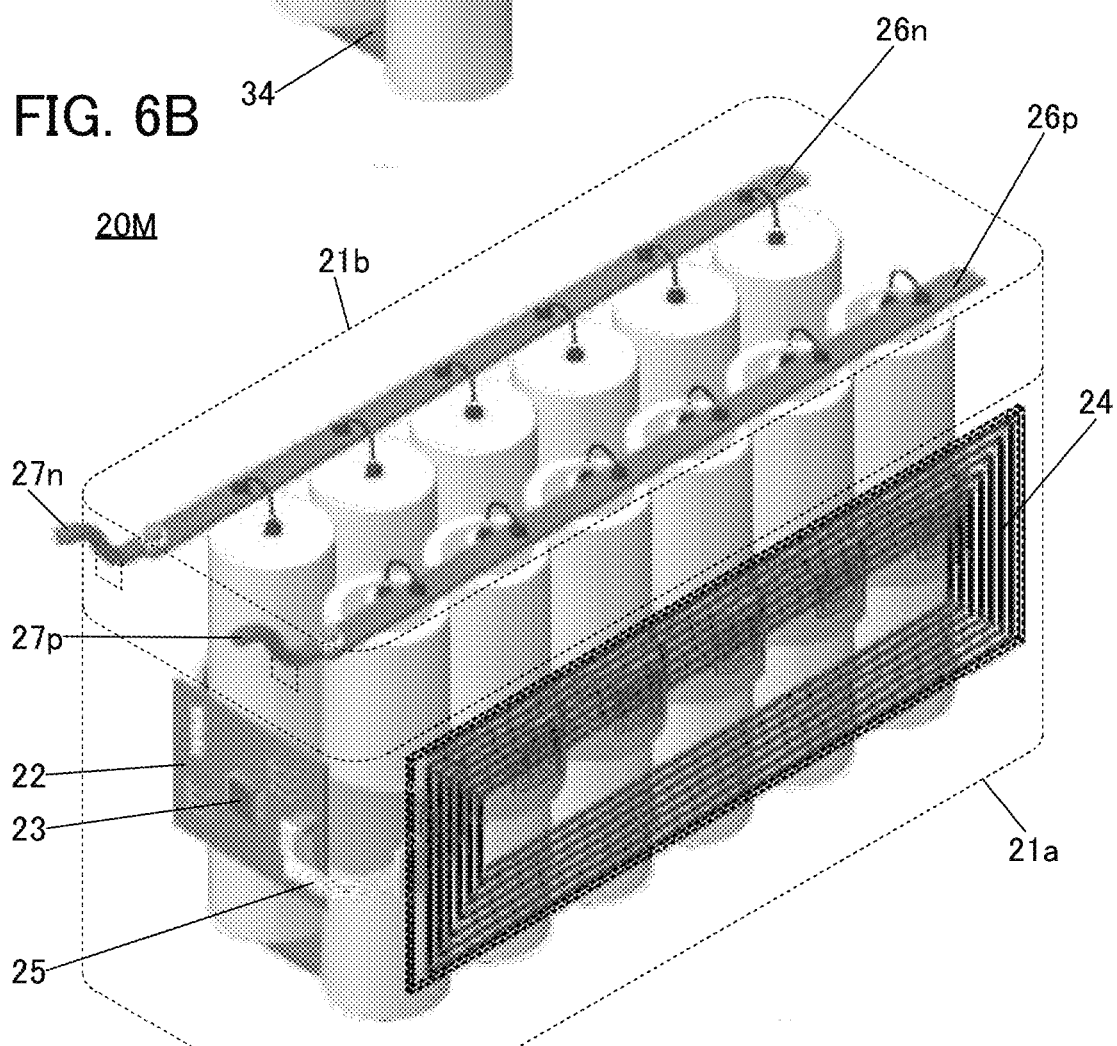

FIG. 6(A) shows an external view of the battery unit 20 including the cylindrical battery 30a, the cylindrical battery 30b, and the semiconductor device 10. FIG. 6(B) shows an external view of a battery module 20M including six battery units 20.

In the battery unit 20, two batteries are connected in series with a conductive member 34. A lead line 33 is bonded to each of a positive electrode terminal of the battery 30a and a negative electrode terminal of the battery 30b. The semiconductor device 10 is fixed to wind around the exterior bodies of the two batteries. The antenna 14 of the semiconductor device 10 is provided along a side surface of the battery 30a. Although not illustrated, the terminal 13a and the terminal 13b of the semiconductor device 10 are electrically connected to the exterior body of the battery 30a and the exterior body of the battery 30b, respectively.

The battery module 20M includes an exterior body 21a, an exterior body 21b, a printed circuit board 22, an IC 23, an antenna 24, a connector wiring 25, a pair of conductive members (conductive members 26p and 26n), a pair of wirings (wirings 27p and 27n), and the like. Note that in FIG. 6(B), as for the exterior body 21a and the exterior body 21b, only the outlines are denoted by a dashed line.

The battery module 20M has a structure in which six battery units 20 each including two batteries connected in series are connected in parallel. Each of the positive electrode terminals 31p of the six batteries 30 on one side is bonded to the conductive member 26p by the lead 33.

Moreover, each of the negative electrode terminals 31n of the six batteries 30 on the other side is bonded to the conductive member 26n by the lead 33. The conductive member 26p and the conductive member 26n are electrically connected to the wiring 27p and the wiring 27n, respectively. Each of the wiring 27p and the wiring 27n is extracted out through a hole provided in the exterior body 21b.

The IC 23 is mounted on the printed circuit board 22. The IC 23 corresponds to the control portion 41, the wireless communication portion 42, or the like of the control device 40. Note that a plurality of ICs having different functions may be mounted. The printed circuit board 22 and a substrate (denoted by a dashed line) provided with the antenna 24 are connected to each other through the connector wiring 25.

The antenna 24 is provided to be fixed to the exterior body 21a to face the antennas 14 of the battery units 20.

[Structure Example 2]

Figure 7A:
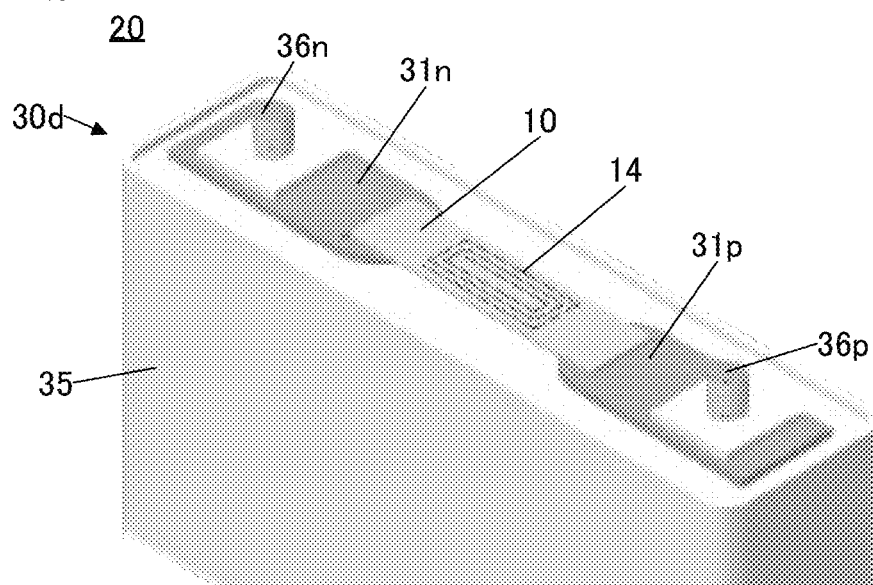
FIG. 7 Structure examples of a battery unit and a battery module.
Figure 7B:
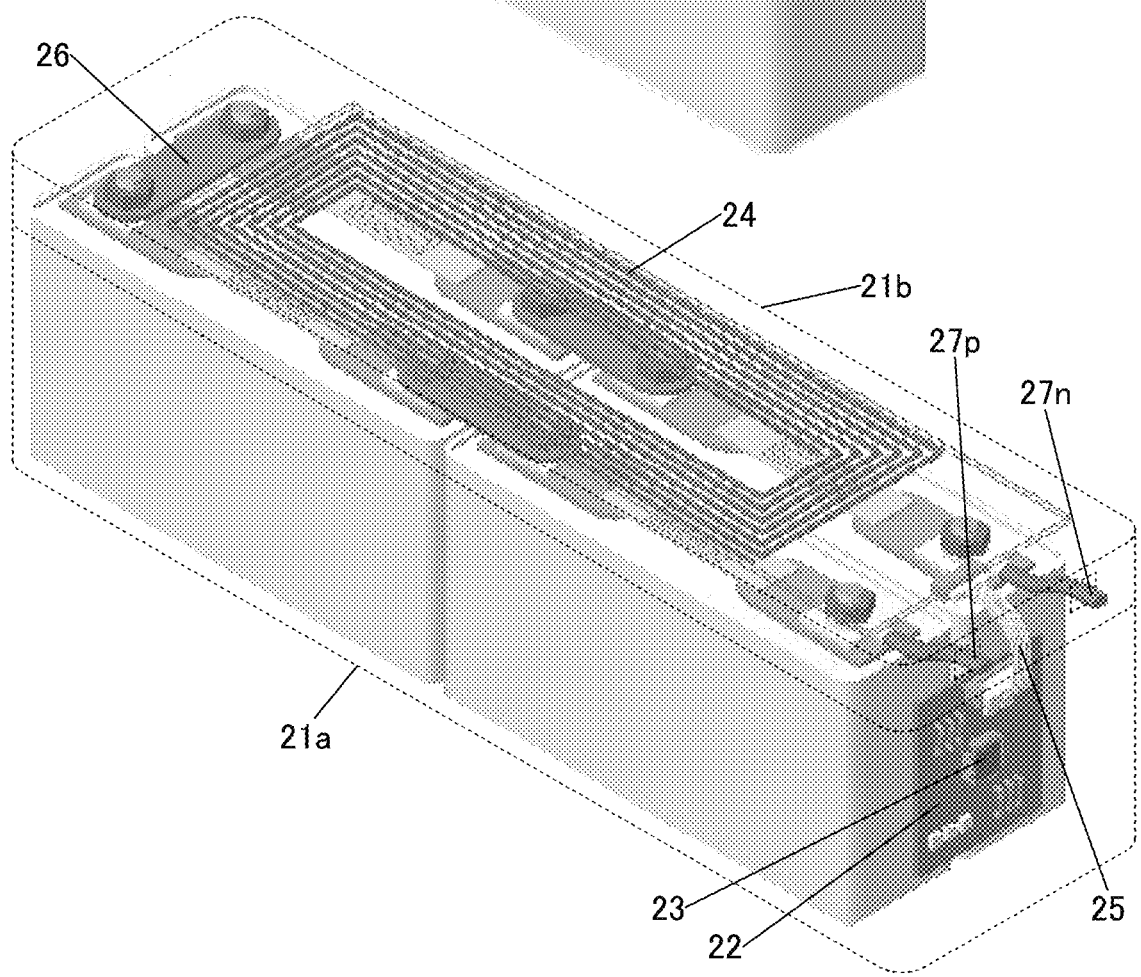

FIG. 7(A) illustrates an external view of the battery unit 20 including a boxy battery 30d and the semiconductor device 10. FIG. 7(B) illustrates an external view of the battery module 20M including four battery units 20. The battery module 20M illustrated in FIG. 7(B) has a structure in which four batteries 30d are connected in series.

In the battery unit 20, the positive electrode terminal 31p and the negative electrode terminal 31n are provided over an upper portion of an exterior body 35. Moreover, the positive electrode terminal 31p and the negative electrode terminal 31n are provided with a connection terminal 36p and a connection terminal 36n, respectively, each of which has been subjected to threading.

The semiconductor device 10 is fixed to get across the positive electrode terminal 31p and the negative electrode terminal 31n. The antenna 14 of the semiconductor device 10 is positioned above the battery unit 20. Although not illustrated, the terminal 13a and the terminal 13b of the semiconductor device 10 are electrically connected to the positive electrode terminal 31p and the negative electrode terminal 31n, respectively.

The battery module 20M illustrated in FIG. 7(B) includes the exterior body 21a, the exterior body 21b, the printed circuit board 22, the IC 23, the antenna 24, the connector wiring 25, the conductive member 26, the wiring 27p, the wiring 27n, and the like. The conductive member 26 is screwed to connection terminals having different polarities of the two batteries 30d and electrically connects them to each other. Each of the wiring 27p and the wiring 27n is screwed and electrically connected to a connection terminal of the battery 30d.

A substrate provided with the antenna 24 is provided on the exterior body 21b side to face the antennas 14 of the four battery units 20. The substrate provided with the antenna 24 is electrically connected to the printed circuit board 22 through the connector wiring 25.

The battery module 20M illustrated in FIG. 7(B) can have a large capacitance per battery unit 20, and thus can be favorably used for a stationary storage device such as power storage equipment for home use or uninterruptible power supply or a vehicle such as an electric vehicle or a hybrid electric vehicle.

[Structure Example 2 of Semiconductor Device]

More specific structure examples of the semiconductor device 10 and an example of a manufacturing method thereof will be described below with reference to drawings.

[Structure Example]

Figure 8A:
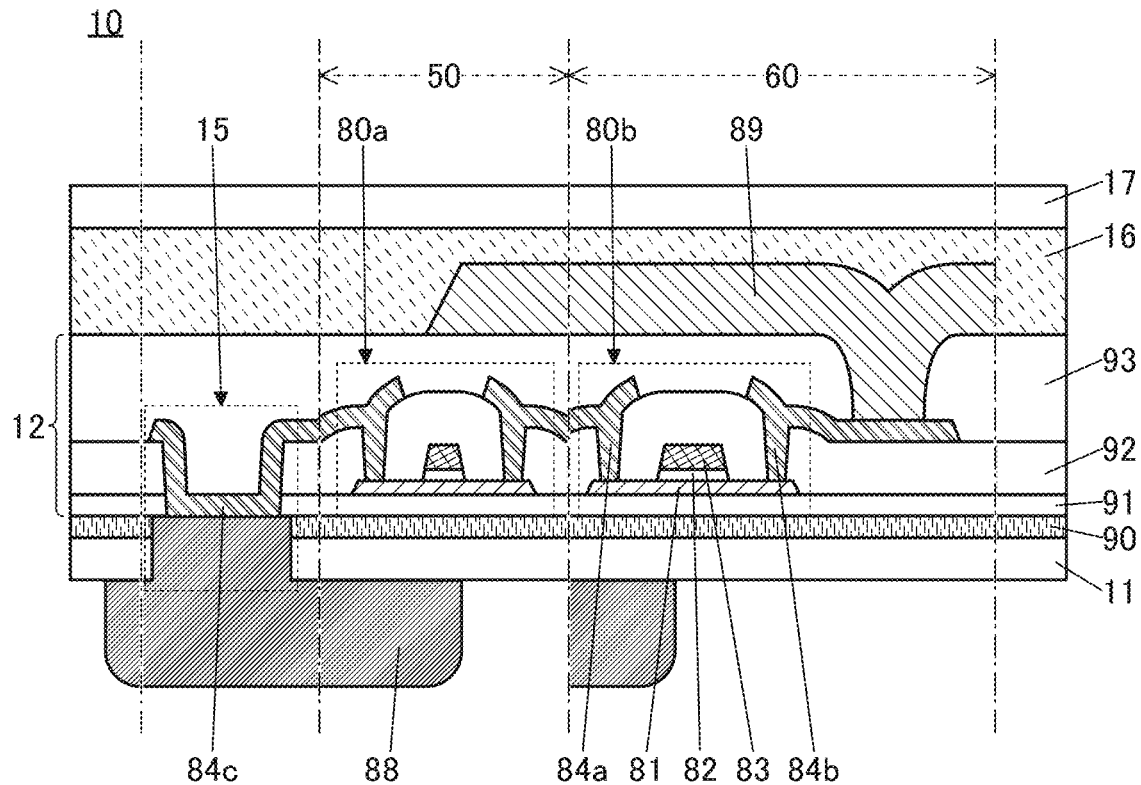
FIG. 8 Structure examples of a semiconductor device.

FIG. 8(A) illustrates a schematic cross-sectional view of the semiconductor device 10 described as an example in FIG. 2. FIG. 8(A) illustrates a schematic cross-sectional view of the semiconductor device 10 in a region including the connection portion 15, a region including the first circuit 50, and a region including the second circuit 60. FIG. 8(A) illustrates an example in which a transistor 80a and a transistor 80b are provided as the first circuit 50 and the second circuit 60, respectively.

The semiconductor device 10 illustrated in FIG. 8(A) as an example includes the substrate 11, the substrate 17, the transistor 80a, the transistor 80b, a plurality of conductive layers 88, a conductive layer 89, and the like. In addition, an insulating layer 91, an insulating layer 92, an insulating layer 93, the protective layer 16, a bonding layer 90, and the like are included. Note that a structure excluding the substrate 17 in FIG. 8(A) corresponds to that of the semiconductor device 10 illustrated in FIG. 1(C).

Each of the plurality of conductive layers 88 functions as a terminal (external connection terminal) and corresponds to the terminal 13a or the terminal 13b in FIG. 2 and the like. The conductive layer 89 functions as an antenna and corresponds to the antenna 14 in FIG. 2 and the like.

The substrate 11 is attached to one surface of the insulating layer 91 with the bonding layer 90 therebetween. The transistor 80a, the transistor 80b, and the like are provided over the other surface of the insulating layer 91. Moreover, the insulating layer 93 is provided to cover the transistor 80a, the transistor 80b, and the like.

Each of the transistor 80a and the transistor 80b includes a semiconductor layer 81, an insulating layer 82 functioning as a gate insulating layer, a conductive layer 83 functioning as a gate electrode, and a pair of conductive layers (a conductive layer 84a and a conductive layer 84b) functioning as a source electrode and a drain electrode.

Each of the transistor 80a and the transistor 80b illustrated in FIG. 8(A) is a so-called top-gate transistor in which a gate electrode is included over the semiconductor layer 81. A portion of the semiconductor layer 81 overlapping with the conductive layer 83 functions as a channel formation region. A portion of the semiconductor layer 81 that is in contact with the conductive layer 84a or the conductive layer 84b functions as a low-resistance region.

The conductive layer 89 functioning as an antenna is provided over the insulating layer 93. The conductive layer 89 is electrically connected to the conductive layer 84b of the transistor 80b through an opening provided in the insulating layer 93.

The conductive layer 88 functioning as a terminal is provided on a rear surface side of the substrate 11. The conductive layer 84c and the conductive layer 88 are electrically connected to each other in the connection portion 15. The conductive layer 84c is a wiring obtained by processing the same conductive film as the conductive layer 84a or the like. In addition, a portion of the conductive layer 84c that is provided to cover an opening provided in the insulating layer 92 and the insulating layer 91 functions as a surface in contact with the conductive layer 88. Furthermore, in a region overlapping with the contact surface of the conductive layer 84c, the bonding layer 90 and the substrate 11 are partly opened, and the conductive layer 88 is electrically connected to the conductive layer 84c through the opening.

In FIG. 8(A), a stacked-layer structure from the insulating layer 91 to the insulating layer 93 corresponds to the element layer 12. In the semiconductor device 10, the conductive layer 89 functioning as an antenna is provided on one side and the conductive layer 88 functioning as a terminal is provided on the other side with the element layer 12 sandwiched therebetween. The semiconductor device 10 in which the terminal and the antenna are provided back to back can be easily downsized, and the response via wireless communication can be extremely fast as compared to the case where they are provided on the same surface side.

When a flexible substrate is used as the substrate 11, the semiconductor device 10 can be attached along a curved surface of a sensing target. Thus, the degree of freedom of the shape of a sensing target, the position to which the semiconductor device 10 is attached, and the like can be increased, so that the convenience and the versatility can be further improved. In addition, the semiconductor device 10 itself can be easily reduced in weight and thus is suitable for mobile use, a biological information terminal device, or the like.

Figure 8B:
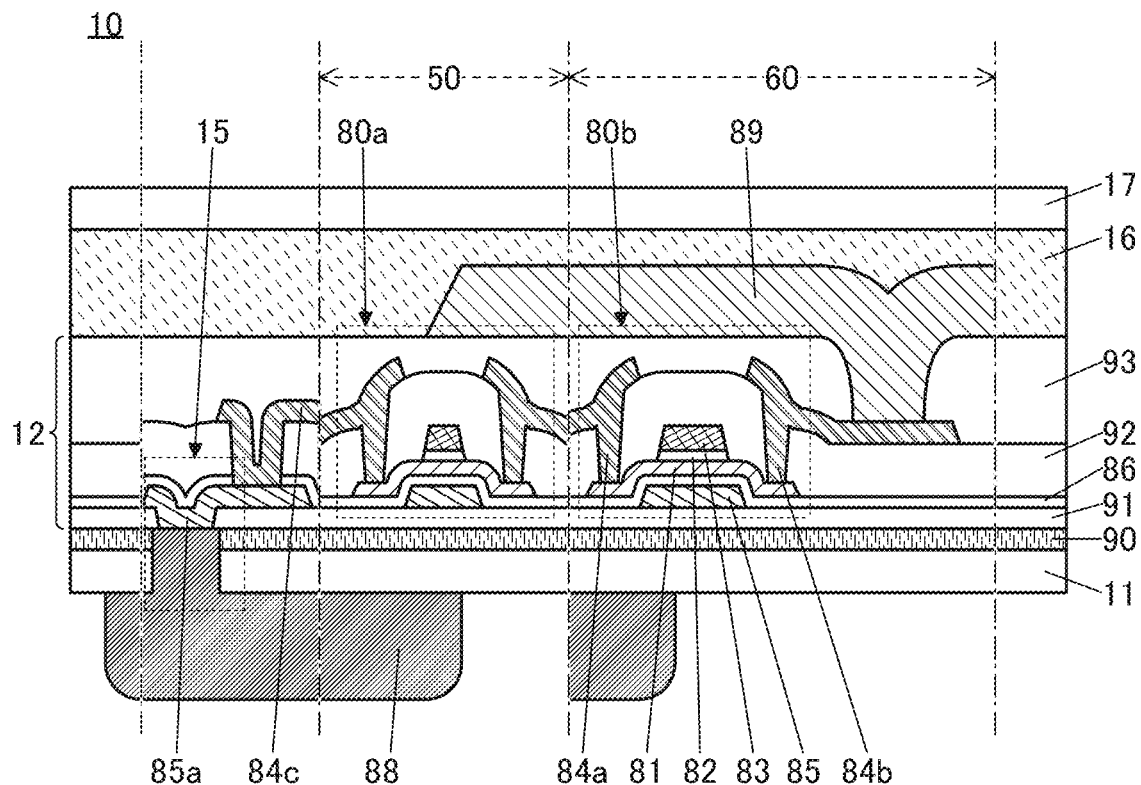

FIG. 8(B) illustrates an example of the transistor 80a and the transistor 80b having a structure different from that in FIG. 8(A).

The transistor 80a and the transistor 80b include an insulating layer 86 between the semiconductor layer 81 and the insulating layer 91. A conductive layer 85 overlapping with the semiconductor layer 81 and the conductive layer 83 is provided between the insulating layer 86 and the insulating layer 91. The conductive layer 85 functions as a second gate electrode and part of the insulating layer 86 functions as a second gate insulating layer.

For example, by applying a predetermined potential to one of the gate electrodes, the threshold voltage when the transistor is driven by the other gate electrode can be controlled. By applying the same potential to the pair of gate electrodes to drive the transistor, a current flowing through the transistor (also referred to as an on-state current) can be increased.

In the connection portion 15, a conductive layer 85a obtained by processing the same conductive film as the conductive layer 85 is electrically connected to the conductive layer 88. The conductive layer 85a is electrically connected to the conductive layer 84c through an opening provided in the insulating layer 86 and the insulating layer 92.

In the transistor 80a and the transistor 80b exemplified in each of FIGS. 8(A) and 8(B), a semiconductor material such as silicon, germanium, or an oxide semiconductor can be used for the semiconductor layer 81 in which a channel is formed.

Although amorphous silicon may be used as silicon, it is preferable to use crystalline silicon such as single crystal silicon or polycrystalline silicon because the transistor can have high reliability and can allow a large amount of current to flow therethrough.

It is particularly preferable to use, as each of the transistor 80a and the transistor 80b, a transistor including an oxide semiconductor (a metal oxide having semiconductor characteristics). In particular, with use of an oxide semiconductor having crystallinity, a transistor having high reliability and achieving high field-effect mobility can be obtained. Furthermore, it is particularly preferable to use an oxide semiconductor whose carrier concentration is sufficiently reduced because a transistor having an extremely low leakage current in an off state (off-state current) can be obtained, leading to reduced standby power of the semiconductor device 10.

[Manufacturing Method Example]

For an example of a method for manufacturing a semiconductor device, the description will be made below using the semiconductor device 10 illustrated in FIG. 8(B) as an example.

Each of FIG. 9 to FIG. 12 is a schematic cross-sectional view of respective steps of a process of a manufacturing method described below.

Note that thin films that form the semiconductor device (insulating films, semiconductor films, conductive films, and the like) can be formed by a sputtering method, a chemical vapor deposition (CVD) method, a vacuum evaporation method, a pulse laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

The thin films that form the semiconductor device (insulating films, semiconductor films, conductive films, and the like) can be formed by a method such as spin coating, dipping, spray coating, ink jetting, dispensing, screen printing, offset printing, a doctor knife, slit coating, roll coating, curtain coating, or knife coating.

When the thin films that form the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask.

There are two typical examples of a photolithography method. In one of the methods, a resist mask is formed over a thin film that is to be processed, and the thin film is processed by etching or the like, so that the resist mask is removed. In the other method, after a photosensitive thin film is deposited, exposure and development are performed, so that the thin film is processed into a desired shape.

For light for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

Figure 9A:
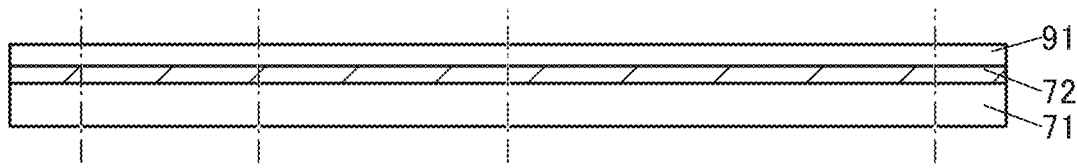
FIG. 9 Diagrams illustrating a method for manufacturing a semiconductor device.

First, a support substrate 71 is prepared, and a separation layer 72 and the insulating layer 91 are formed to be stacked over the support substrate 71 (FIG. 9(A)).

As the support substrate 71, a substrate having rigidity high enough to be easily transferred in an apparatus or between apparatuses can be used. In addition, a substrate which is resistant to heat applied during the manufacturing process is used. For example, an insulating substrate such as a semiconductor substrate, a metal substrate, or a glass substrate can be used. For example, a glass substrate with a thickness larger than or equal to 0.3 mm and smaller than or equal to 1 mm can be used.

As materials used for the separation layer 72 and the insulating layer 91, materials with which separation occurs at the interface between the separation layer 72 and the insulating layer 91 or in the separation layer 72 can be selected.

For example, as the separation layer 72, a stack of a layer containing a high-melting-point metal material such as tungsten and a layer containing an oxide of the metal material can be used, and as the insulating layer 91, a stacked layer of an inorganic insulating material such as silicon nitride, silicon oxide, silicon oxynitride, or silicon nitride oxide can be used. It is preferable that a high-melting-point metal material be used for the separation layer 72 because in treatment at high temperature can be performed in the following process and thus the degree of freedom in selecting a material or a formation method can be increased.

In the case where a stacked-layer structure of tungsten and tungsten oxide is used for the separation layer 72, separation can be performed at the interface between the tungsten and the tungsten oxide, in the tungsten oxide, or at the interface between the tungsten oxide and the insulating layer 91.

Alternatively, an organic resin may be used for the separation layer 72 so that separation is performed at the interface between the support substrate 71 and the separation layer 72, in the separation layer 72, or at the interface between the separation layer 72 and the insulating layer 91.

Typically, a polyimide resin can be used for the separation layer 72. A polyimide resin is preferable because of its excellent heat resistance. Note that other than that, an acrylic resin, an epoxy resin, a polyamide resin, a polyimide-amide resin, a siloxane resin, a benzocyclobutene-based resin, a phenol resin, or the like can be used for the separation layer 72.

For the separation layer 72 containing an organic resin, first, a mixed material of a resin precursor and a solvent is formed over the support substrate 71 by a method such as spin coating, dipping, spray coating, inkjet printing, dispensing, screen printing, or offset printing, or with a doctor knife, a slit coater, a roll coater, a curtain coater, or a knife coater. After that, heat treatment is performed to remove the solvent and the like and cure the material, so that the separation layer 72 containing the organic resin can be formed.

For example, when polyimide is used for the separation layer 72, a resin precursor that can generate an imide bond by dehydration can be used. Alternatively, a material containing a soluble polyimide resin may be used.

When an organic resin is used for the separation layer 72, either a photosensitive resin or a nonphotosensitive resin can be used. A photosensitive polyimide is a material that is suitably used for a planarization film or the like, and therefore, the formation apparatus and the material can be shared. Thus, there is no need to prepare a new apparatus or a new material to obtain the structure of one embodiment of the present invention. Furthermore, with the use of a photosensitive resin material, the separation layer 72 can be processed by light exposure and development treatment. For example, an opening can be formed and an unnecessary portion can be removed. Moreover, by optimization of a light exposure method or light exposure conditions, an uneven shape can be formed on a surface of the separation layer. For example, a multiple light exposure technique or a light exposure technique using a half-tone mask or a gray-tone mask is used.

In the case where an organic resin is used for the separation layer 72, heating the separation layer 72 locally can improve the separability in some cases. For example, laser irradiation is given as a heating method. It is preferable to use linear laser as laser light and perform its scanning for the laser irradiation. This can shorten the process time in the case of using a large support substrate. As the laser light, excimer laser with a wavelength of 308 nm can be suitably used.

When the separability is to be improved by light irradiation with laser light or the like, a heat generation layer may be provided to overlap with the separation layer 72. The heat generation layer is a layer having a function of generating heat by absorbing light. The heat generation layer is preferably provided between the support substrate 71 and the separation layer 72, but may be provided over the separation layer 72. A material that can absorb part of light used as laser light or the like can be used for the heat generation layer. For example, a metal, an oxide, or the like can be used for the heat generation layer when excimer laser with a wavelength of 308 nm is used as the laser light. For example, a metal such as titanium or tungsten, an oxide conductive material such as titanium oxide, tungsten oxide, indium oxide, or indium tin oxide, or an indium-containing oxide semiconductor material can be used.

For an improvement in the separability, a layer containing oxygen, hydrogen, water, or the like may be provided in contact with the separation layer 72, and by heat treatment, the oxygen, the hydrogen, the water, or the like may be supplied into the separation layer 72, or at the interface between the separation layer 72 and the layer. Alternatively, oxygen, hydrogen, water, or the like may be supplied to the support substrate 71. Alternatively, oxygen, hydrogen, water, or the like may be supplied to the separation layer 72. When heat treatment or plasma treatment is performed in an atmosphere containing oxygen, hydrogen, water, or the like, they can be supplied to the support substrate 71 and the separation layer 72. Thus, there is no need to use a laser apparatus or the like, leading to a lower manufacturing cost for a semiconductor device.

After separation, part of the separation layer 72 remains in some cases. The remaining separation layer 72 having conductivity may cause an electrical short circuit and thus is preferably removed by etching. Note that the separation layer 72 may be left.

Figure 9B:
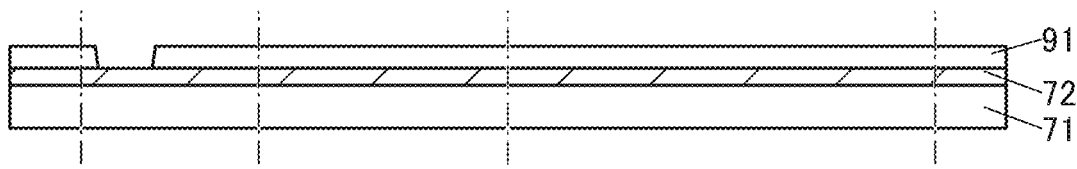

Next, part of the insulating layer 91 is removed by etching, whereby the separation layer 72 is exposed (FIG. 9(B)).

Figure 9C:
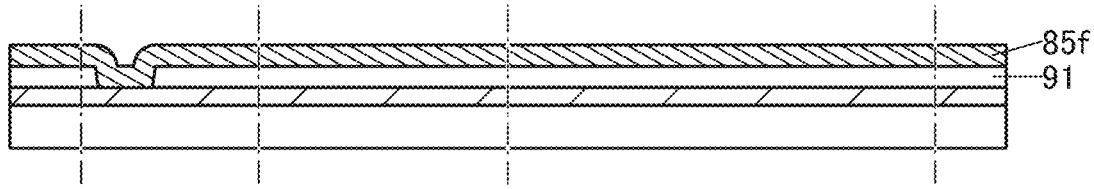

Then, a conductive film 85f is deposited over the insulating layer 91 (FIG. 9(C)). Part of the conductive film 85f is provided to cover the opening provided in the insulating layer 91.

Figure 9D:
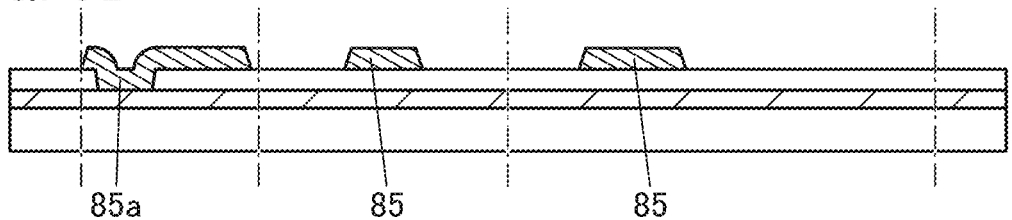

Next, the conductive film 85f is processed to form a conductive layer 85 and a conductive layer 85a (FIG. 9(D)). The conductive layer 85 and the conductive layer 85a can be formed in such a manner that a resist mask is formed over the conductive film 85f, part of the conductive film 85f is etched, and then the resist mask is removed.

Figure 9E:
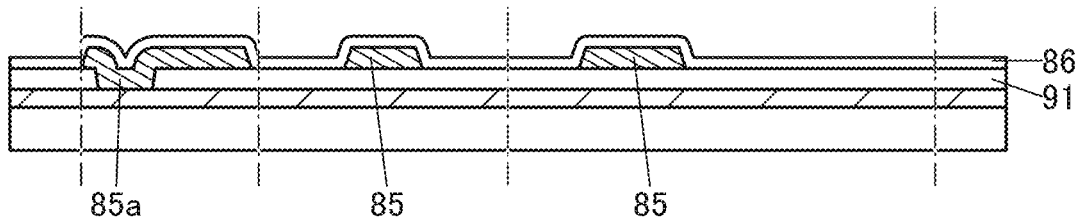

Next, the insulating layer 86 is formed to cover the insulating layer 91, the conductive layer 85, and the conductive layer 85a (FIG. 9(E)).

Figure 9F:
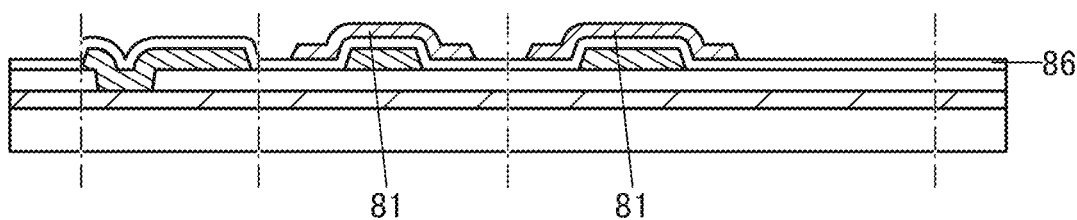

Next, the semiconductor layer 81 is formed over the insulating layer 86 (FIG. 9(F)). The semiconductor layer 81 can be formed in such a manner that a semiconductor film (not illustrated) is deposited over the insulating layer 86, a resist mask is formed over the semiconductor film, part of the semiconductor film is removed by etching, and then, the resist mask is removed.

Figure 10A:
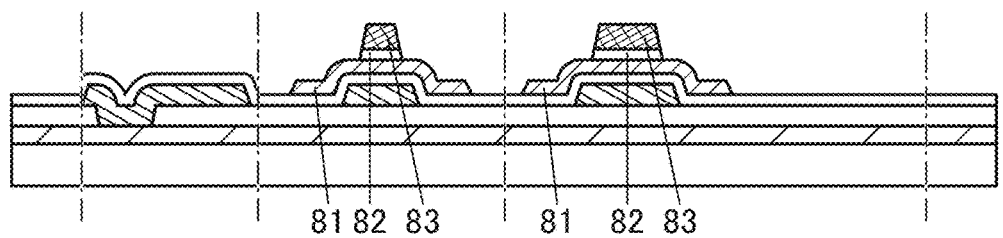
FIG. 10 Diagrams illustrating a method for manufacturing a semiconductor device.

Next, the insulating layer 82 and the conductive layer 83 are formed over the semiconductor layer 81 (FIG. 10(A)). The insulating layer 82 and the conductive layer 83 can be formed in such a manner that a stack of an insulating film and a conductive film is deposited to cover the semiconductor layer 81, a resist mask is formed over the conductive film, and the conductive film and the insulating film are etched using the resist mask, for example. Accordingly, the insulating layer 82 and the conductive layer 83 having substantially the same top surface shape can be formed.

Note that in this specification and the like, the expression "having substantially the same top surface shape" means that at least outlines of stacked layers partly overlap with each other. For example, the case of processing or partly processing an upper layer and a lower layer with the use of the same mask pattern is included. The expression "having substantially the same top surface shape" also includes the case where the outlines do not completely overlap with each other; for instance, the edge of the upper layer may be positioned on the inner side or the outer side of the edge of the lower layer.

Note that a structure may be employed in which only the conductive film to be the conductive layer 83 is etched and the insulating film to be the insulating layer 82 is not etched. In this case, for example, the insulating layer 82 is provided over the entire substrate and provided to cover an end portion of the semiconductor layer 81 and the insulating layer 86.

Figure 10B:
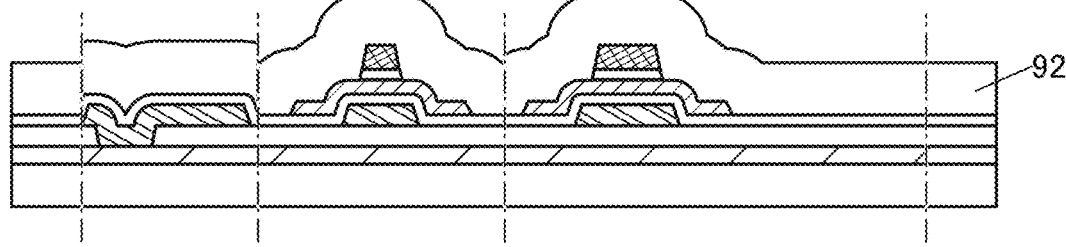

Next, the insulating layer 92 is formed to cover the insulating layer 86, the semiconductor layer 81, the insulating layer 82, the conductive layer 83, and the like (FIG. 10(B)). After that, the insulating layer 92 is partly etched, so that an opening reaching the semiconductor layer 81 is formed. At this time, the insulating layer 92 and the insulating layer 86 positioned over the conductive layer 85a are partly etched simultaneously to form an opening reaching the conductive layer 85a.

Figure 10C:
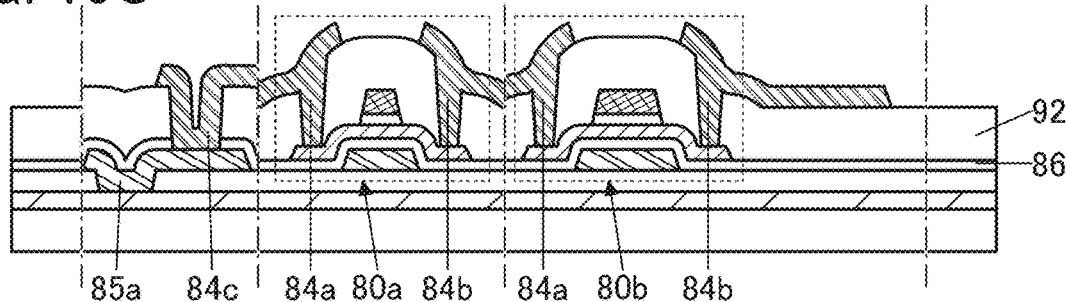

Next, a conductive film is deposited and partly removed by etching, whereby the conductive layer 84a, the conductive layer 84b, the conductive layer 84c, and the like are formed (FIG. 10(C)).

At this stage, the transistor 80a and the transistor 80b can be formed.

Figure 10D:
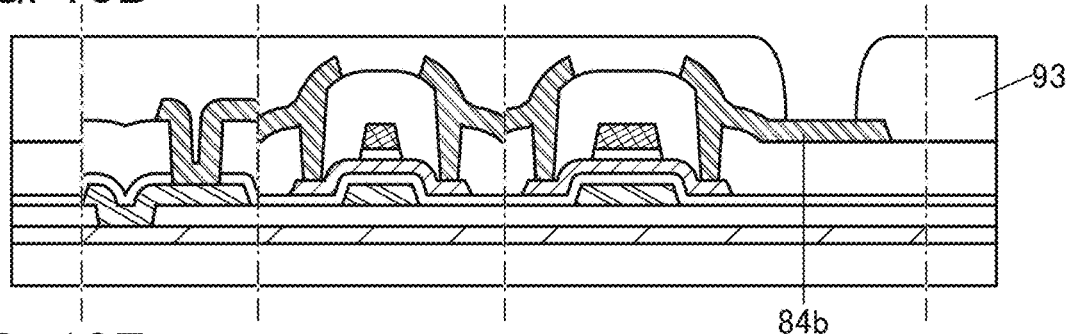
Figure 10E:
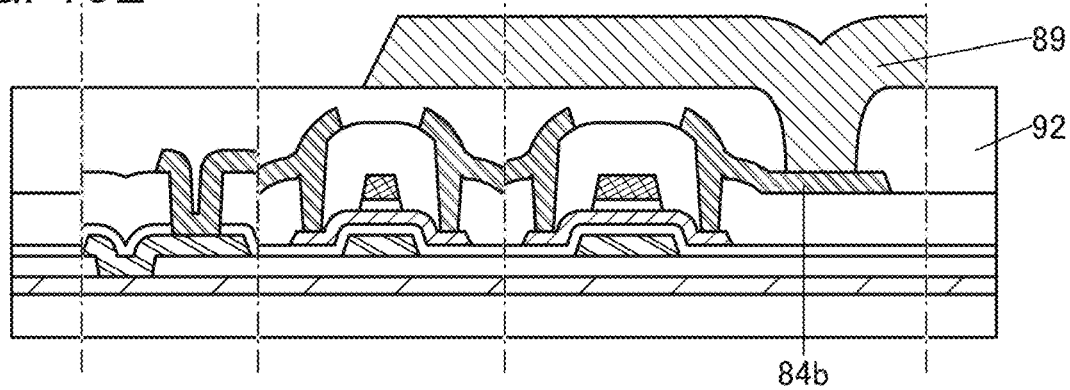

Next, the insulating layer 93 having an opening reaching the conductive layer 84b of the transistor 80b is formed to cover the transistor 80a, the transistor 80b, and the like is formed (FIG. 10(D)). When a photosensitive material is used for the insulating layer 93, an opening can be formed by a photolithography technique or the like. It is particularly preferable to use an organic insulating film for the insulating layer 93 because the planarity of the surface thereof is improved. Note that after the insulating layer 93 not including an opening is formed, an opening may be formed in the insulating layer 93 by etching with the use of a resist mask.

Then, the conductive layer 89 in contact with the conductive layer 84b through the opening in the insulating layer 93 is formed. The conductive layer 89 can be formed by a method similar to those of the conductive layer 83 and the like.

Figure 11A:
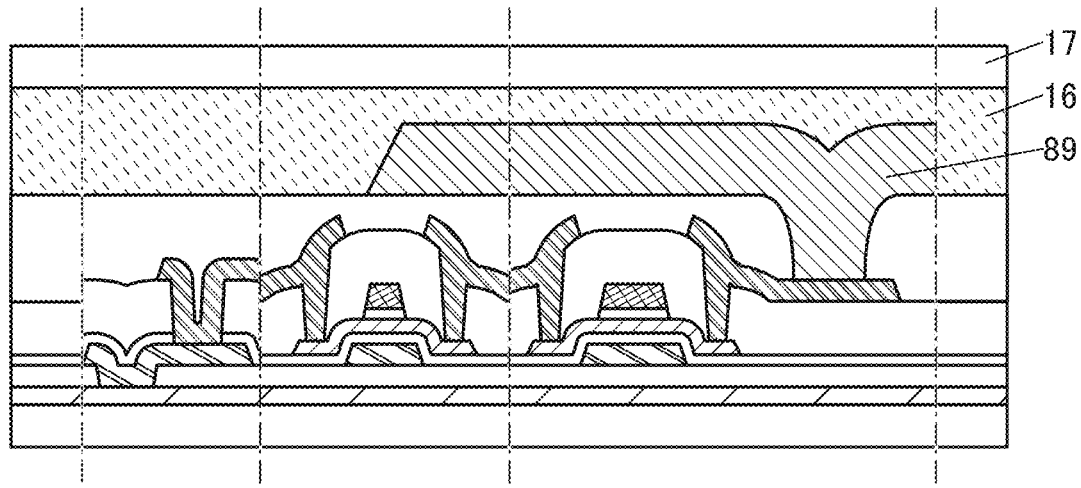
FIG. 11 Diagrams illustrating a method for manufacturing a semiconductor device.

Next, the substrate 17 is attached with the protective layer 16 functioning as a bonding layer (FIG. 11(A)). For the protective layer 16, a curable organic resin is preferably used. For the substrate 17, a flexible material is preferably used.

Note that a structure may be employed in which only the protective layer 16 is provided and the substrate 17 is not included.

Figure 11B:
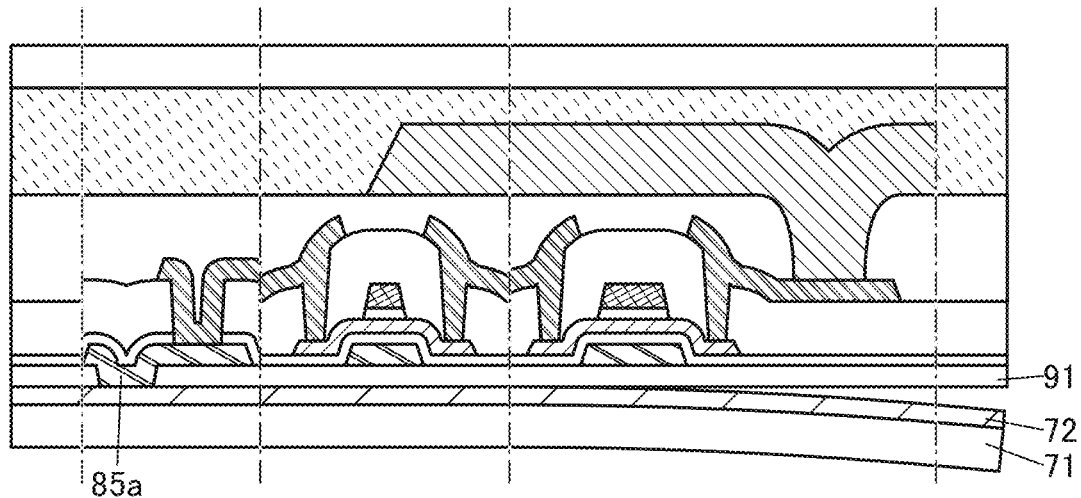

Then, separation is caused between the separation layer 72 and each of the insulating layer 91 and the conductive layer 85a, so that the support substrate 71 and the separation layer 72 are removed (FIG. 11(B)).

As a separation method, applying mechanical force, etching the separation layer, and making a liquid permeate the separation interface by dripping the liquid or soaking in the liquid are given as examples. Alternatively, separation may be performed by heating or cooling two layers of the separation interface by utilizing a difference in thermal expansion coefficient.

Furthermore, heat treatment may be performed for increased separability. The heat treatment can be performed anytime after the formation of the insulating layer 91 but is preferably performed immediately before the separation. When a method which enables instantaneous local heating, such as laser annealing or lamp annealing, is used as the heat treatment, thermal degradation of the transistor, the wiring, and the like can be suppressed.

In addition, treatment for exposing part of the separation interface may be performed before the separation is performed. For example, with a laser, a sharp tool, or the like, part of the insulating layer 91 on the separation layer 72 is removed. Thus, using a portion in which the insulating layer 91 is removed as a starting point (a trigger), the separation can be performed.

In some cases, part of the separation layer 72 remains after the separation. In such a case, the remaining separation layer 72 is preferably removed by cleaning, etching, plasma treatment, wiping treatment, or the like. In particular, the remaining separation layer 72 is preferably removed when having conductivity. Moreover, it is preferable to perform reduction treatment after the separation layer 72 is removed in order to prevent a surface of the conductive layer 85a from being insulated because of oxidation or the like.

Figure 11C:
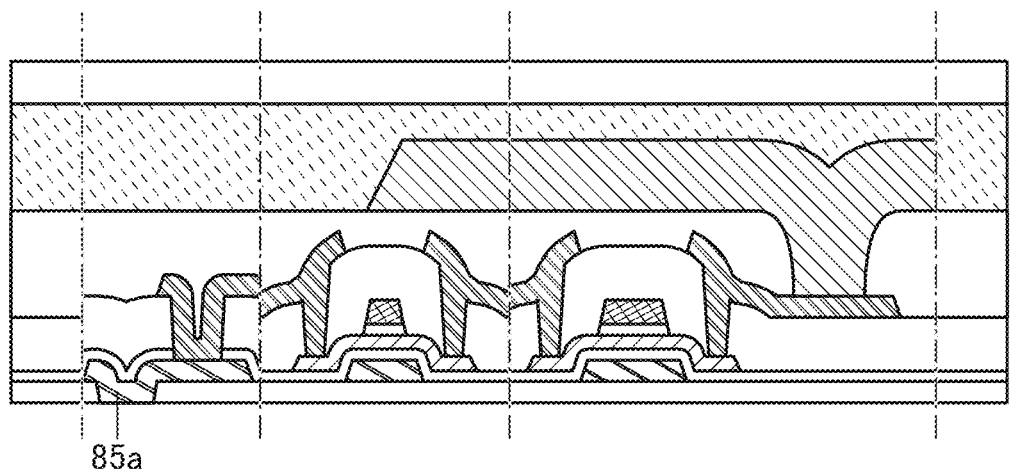

FIG. 11(C) illustrates a state in which the support substrate 71 and the separation layer 72 are removed and part of the conductive layer 85a is exposed.

Figure 12A:
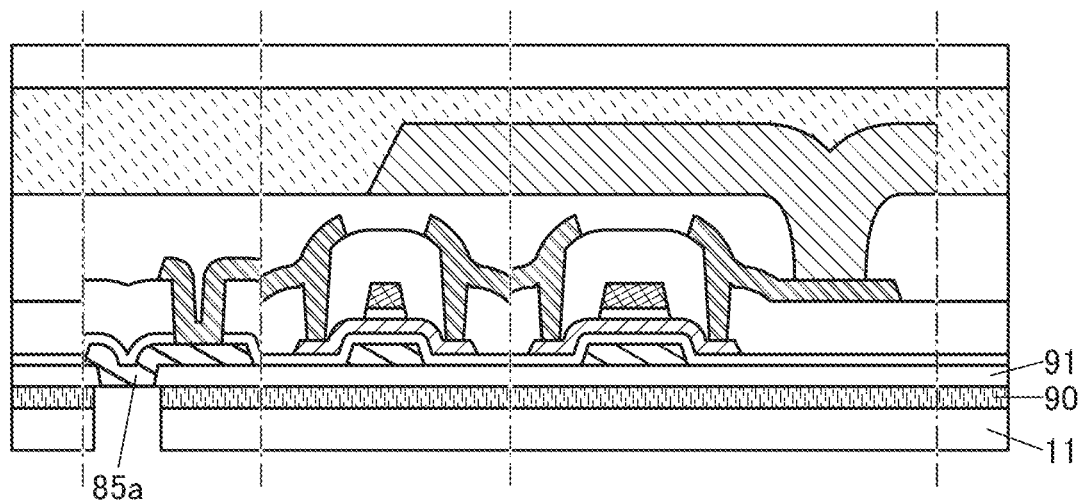
FIG. 12 Diagrams illustrating a method for manufacturing a semiconductor device.

Next, the insulating layer 91 and the substrate 11 are attached to each other with the bonding layer 90 (FIG. 12(A)). At this time, it is preferable to use, as the substrate 11, a substrate in which a portion overlapping with the exposed portion of the conductive layer 85a is cut or included as an opening. In addition, the bonding layer 90 is preferably formed not to be attached to the exposed portion of the conductive layer 85a.

Figure 12B:
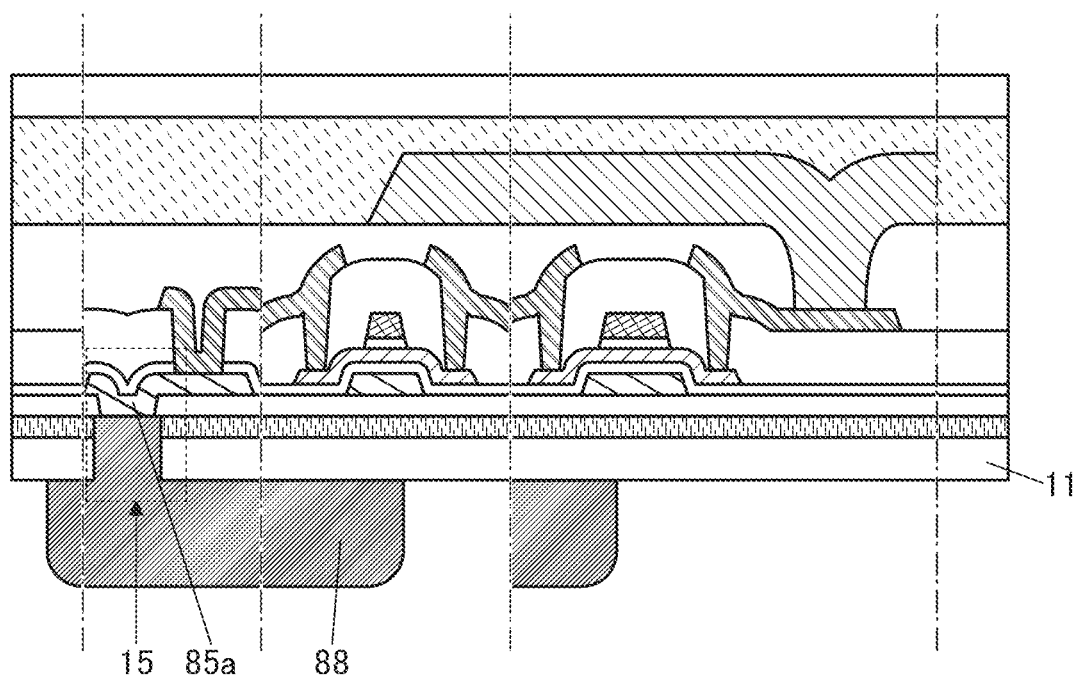

After that, the conductive layer 88 is formed to be in contact with the conductive layer 85a on the rear surface side of the substrate 11 (FIG. 12(B)).

Through the above steps, the semiconductor device 10 can be manufactured. The drawing shown in FIG. 12(B) is the same as the drawing shown in FIG. 8(B).

The above is the description of an example of the method for manufacturing the semiconductor device 10.

[Supplementary Note]

In this specification and the like, a transistor is an element having at least three terminals of a gate, a drain, and a source. A channel formation region is included between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Thus, the terms of source and drain are interchangeable for use in this specification and the like.

Furthermore, in this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "parallel" indicates a state where two straight lines are placed such that the angle formed therebetween is greater than or equal to −10° and less than or equal to 10°. Thus, the case where the angle is greater than or equal to −5° and less than or equal to 5° is also included. In addition, "perpendicular" indicates a state where two straight lines are placed such that the angle formed therebetween is greater than or equal to 80° and less than or equal to 100°. Thus, the case where the angle is greater than or equal to 85° and less than or equal to 95° is also included.

Moreover, in this specification and the like, the term "film" and the term "layer" can be interchanged with each other. For example, the term "conductive layer" can be changed into the term "conductive film" in some cases. Alternatively, for example, the term "insulating film" can be changed into the term "insulating layer" in some cases.

Unless otherwise specified, an off-state current in this specification and the like refers to a drain current of a transistor in an off state (also referred to as a non-conduction state or a cutoff state). Unless otherwise specified, the off state of an n-channel transistor refers to a state where the voltage Vgs between its gate and source is lower than the threshold voltage Vth, and the off state of a p-channel transistor refers to a state where the voltage Vgs between its gate and source is higher than the threshold voltage Vth.

The off-state current of a transistor depends on Vgs in some cases. Thus, when there is Vgs with which the off-state current of the transistor is lower than or equal to I, it may be said that the off-state current of the transistor is lower than or equal to I. The off-state current of a transistor means the off-state current in an off state at predetermined Vgs, in an off state at Vgs in a predetermined range, or in an off state at Vgs with which a sufficiently reduced off-state current is obtained, or the like in some cases.

As an example, the assumption is made of an n-channel transistor where the threshold voltage Vth is 0.5 V, and the drain current is $1 \times 10^{-9}$ A at Vgs of 0.5 V, the drain current is $1 \times 10^{-13}$ A at Vgs of 0.1 V, the drain current is $1 \times 10^{-19}$ A at Vgs of −0.5 V, and the drain current is $1 \times 10^{-22}$ A at Vgs of −0.8 V. The drain current of the transistor is lower than or equal to $1 \times 10^{-19}$ A at Vgs of −0.5 V or at Vgs in the range of −0.5 V to −0.8 V; therefore, it is sometimes said that the off-state current of the transistor is lower than or equal to $1 \times 10^{-19}$ A. Since there is Vgs at which the drain current of the transistor is lower than or equal to $1 \times 10^{-22}$ A, it is sometimes said that the off-state current of the transistor is lower than or equal to $1 \times 10^{-22}$ A.

Furthermore, in this specification and the like, the off-state current of a transistor with a channel width W is sometimes represented by a current value per channel width W. Alternatively, it is sometimes represented by the value of flowing current per given channel width (e.g., 1 μm). In the latter case, the off-state current is sometimes represented by the unit with the dimension of current per length (e.g., A/μm).

The off-state current of a transistor sometimes depends on temperature. Unless otherwise specified, the off-state current in this specification may be off-state current at room temperature, 60° C., 85° C., 95° C., or 125° C. Alternatively, the off-state current may be off-state current at a temperature at which reliability of a semiconductor device or the like including the transistor is ensured or a temperature at which a semiconductor device or the like including the transistor is used (e.g., any temperature in the range of 5° C. to 35° C.). When there is Vgs at which the off-state current of a transistor at room temperature, 60° C., 85° C., 95° C., 125° C., a temperature at which reliability of a semiconductor device including the transistor is ensured, or a temperature at which the semiconductor device or the like including the transistor is used (e.g., any temperature in the range of 5° C. to 35° C.) is lower than or equal to I, it may be said that the off-state current of the transistor is lower than or equal to I.

The off-state current of a transistor depends on a voltage Vds between its drain and source in some cases. Unless otherwise specified, the off-state current in this specification may be off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at Vds at which reliability of a semiconductor device or the like including the transistor is ensured or Vds used in the semiconductor device or the like including the transistor. When there is Vgs at which the off-state current of a transistor at Vds of 0.1 V, 0.8 V, 1 V, 1.2 V, 1.8 V, 2.5 V, 3 V, 3.3 V, 10 V, 12 V, 16 V, or 20 V, at Vds at which reliability of a semiconductor device including the transistor is ensured, or at Vds used in the semiconductor device or the like including the transistor is lower than or equal to I, it may be said that the off-state current of the transistor is lower than or equal to I.

In the above description of the off-state current, the drain may be replaced with the source. That is, the off-state current sometimes refers to a current that flows through a source of a transistor in an off state.

Furthermore, in this specification and the like, a leakage current sometimes expresses the same meaning as an off-state current. In addition, in this specification and the like, the off-state current sometimes refers to a current that flows between a source and a drain of a transistor in the off state, for example.

Furthermore, in this specification and the like, the threshold voltage of a transistor refers to a gate voltage (Vg) at which a channel is formed in the transistor. Specifically, in a graph where the horizontal axis represents the gate voltage (Vg) and the vertical axis represents the square root of drain current (Id), the threshold voltage of a transistor may refer to a gate voltage (Vg) at the intersection of the square root of drain current (Id) of 0 (Id is 0 A) and an extrapolated straight line that is tangent with the highest inclination to a plotted curve (Vg–√Id characteristics). Alternatively, the threshold voltage of a transistor may refer to a gate voltage (Vg) at which the value of Id [A]×L [μm]/W [μm] is $1\times10^{-9}$ [A] where L is channel length and W is channel width.

Furthermore, in this specification and the like, a "semiconductor" has characteristics of an "insulator" in some cases when the conductivity is sufficiently low, for example. Furthermore, a "semiconductor" and an "insulator" cannot be strictly distinguished from each other in some cases because a border therebetween is not clear. Therefore, a "semiconductor" in this specification and the like can be replaced with an "insulator" in some cases.

Furthermore, in this specification and the like, a "semiconductor" has characteristics of a "conductor" in some cases when the conductivity is sufficiently high, for example. Furthermore, a "semiconductor" and a "conductor" cannot be strictly distinguished from each other in some cases because a border therebetween is not clear. Therefore, a "semiconductor" in this specification and the like can be replaced with a "conductor" in some cases.

Furthermore, in this specification and the like, an atomic ratio being In:Ga:Zn=4:2:3 or a neighborhood thereof refers to an atomic ratio where, when the proportion of In to the total number of atoms of In, Ga, and Zn is 4, the proportion of Ga is greater than or equal to 1 and less than or equal to 3 and the proportion of Zn is greater than or equal to 2 and less than or equal to 4. Furthermore, an atomic ratio being In:Ga:Zn=5:1:6 or a neighborhood thereof refers to an atomic ratio where, when the proportion of In to the total number of atoms of In, Ga, and Zn is 5, the proportion of Ga is greater than 0.1 and less than or equal to 2 and the proportion of Zn is greater than or equal to 5 and less than or equal to 7. Furthermore, an atomic ratio being In:Ga:Zn=1:1:1 or a neighborhood thereof refers to an atomic ratio where, when the proportion of In to the total number of atoms of In, Ga, and Zn is 1, the proportion of Ga is greater than 0.1 and less than or equal to 2 and the proportion of Zn is greater than 0.1 and less than or equal to 2.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. In addition, in the case where an "OS FET" is stated, it can also be called a transistor including a metal oxide or an oxide semiconductor.

Furthermore, in this specification and the like, a metal oxide containing nitrogen is in some cases also collectively referred to as a metal oxide. A metal oxide containing nitrogen may be referred to as a metal oxynitride.

Furthermore, in this specification and the like, CAAC (c-axis aligned crystal) and CAC (Cloud-Aligned Composite) may be stated in some cases. Note that CAAC refers to an example of a crystal structure, and CAC refers to an example of a function or a material composition.

In this specification and the like, a CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, in this specification and the like, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

An example of a crystal structure of a metal oxide is described. Note that a metal oxide deposited by a sputtering method using an In—Ga—Zn oxide target (In:Ga:Zn=4:2:4.1 [atomic ratio]) is described below as an example. A metal oxide formed by a sputtering method using the above-described target at a substrate temperature higher than or equal to 100° C. and lower than or equal to 130° C. is referred to as sIGZO, and a metal oxide formed by a sputtering method using the above-described target with a substrate temperature set at room temperature (R.T.) is referred to as tIGZO. For example, sIGZO has one or both of crystal structures of nc (nano crystal) and CAAC. Furthermore, tIGZO has a crystal structure of nc. Note that room temperature (R.T.) here also includes a temperature in the case where a substrate is not heated intentionally.

Note that the CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

Here, in crystallography, a unit cell is formed with three axes (crystal axes) of the a-axis, the b-axis, and the c-axis; in general, a specific axis is taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure can be classified as a hexagonal system, and in a unit cell thereof, the a-axis and the b-axis are parallel to the plane direction of the layer and the c-axis is orthogonal to the layer (i.e., the a-axis and the b-axis).

At least part of the structural examples, the manufacturing method examples, the drawings corresponding thereto, and the like exemplified in this embodiment can be implemented in combination with the other structural examples, the other manufacturing method examples, the other drawings corresponding thereto, and the like as appropriate.

At least part of this embodiment can be implemented in combination with any of the other embodiments described in this specification as appropriate.

Embodiment 2

In this embodiment, an example of a method for controlling the battery module of one embodiment of the present invention using a neural network will be described.

In this specification, a neural network refers to a general model that is modeled on a biological neural network, determines the connection strength of neurons by learning, and has the capability of solving problems. A neural network includes an input layer, an intermediate layer (also referred to as a hidden layer), and an output layer.

In describing a neural network in this specification, to determine a connection strength of neurons (also referred to as a weight coefficient) from existing information is sometimes referred to as learning.

Moreover, in this specification, to draw a new conclusion from a neural network formed using connection strengths obtained by learning is sometimes referred to as inference.

A system using the neural network of one embodiment of the present invention can be achieved, for example, with a circuit using a transistor including an oxide semiconductor or a metal oxide in its channel formation region.

In addition, a system using the neural network of one embodiment of the present invention can be formed using software and hardware. As a memory of the hardware, a memory provided with a transistor including an oxide semiconductor or a metal oxide in its channel formation region or another known memory may be used. For the operating system of software, a variety of operating systems such as Windows (registered trademark), UNIX (registered trademark), and macOS (registered trademark) can be used. A variety of programming languages such as Python (registered trademark), Go, Perl, Ruby, Prolog, Visual Basic (registered trademark), C, C++, Swift, Java (registered trademark), and .NET can be used for the software application. The application may be formed using a framework such as Chainer (registered trademark) (it can be used with Python), Caffe (it can be used with Python and C++), and TensorFlow (it can be used with C, C++, and Python).

In the battery module 20M exemplified in the above embodiment, a parameter of the battery 30 can be input to the neural network NN, and the state of the battery 30 can be analyzed.

Inside the battery, for example, a phenomenon which reduces the safety of the battery might occur in addition to reversible reactions of charging and discharging. Examples of the phenomenon include a side reaction such as decomposition of an electrolytic solution, deposition of a metal on a surface of an electrode, and the like. These phenomena reduce not only the capacity of the battery but also the safety of the battery in some cases.

Moreover, when charging and discharging of the battery are performed, an increase in the temperature is caused in some cases, and charge and discharge characteristics of the battery vary depending on the temperature. Therefore, it is important to precisely control the temperature of the battery.

In the battery module of one embodiment of the present invention, by measurement of parameters such as a voltage, a current, and a temperature in the process of charging and discharging of the battery, the state of the battery can be analyzed, and the operational conditions of the battery can be determined in accordance with the state of the battery. For example, a charge curve and a discharge curve are analyzed. Here, the charge curve indicates, for example, a shift in voltage or capacity in the charging process. The discharge curve indicates a shift in voltage, capacity, or the like in the discharging process.

It is preferable to use measurement data on the battery as an input parameter to the neural network. For example, the current and voltage of the battery can be sampled at the same time as one set of data, at regular time intervals. Then, predetermined number of sets of data can be stored and used as input parameters. Alternatively, time and a set of data of the current and voltage of the battery at each time can be used as input parameters, for example. Here, the voltage of the battery is, for example, a potential difference between both ends of the battery.

A set of data of capacity and voltage of the battery can be used as an input parameter. The capacity of the battery can be obtained, for example, by the product of the current and time of the battery. The capacity of the battery may be obtained using a coulomb counter CC.

The SOC of the battery may be used as an input parameter. The SOC of the battery is represented, for example, as a ratio of the value obtained by subtracting the absolute value of the discharge capacity from the absolute value of the charge capacity of the battery to the full charge capacity. Alternatively, the SOC of the battery may be obtained by estimation from the voltage of the battery.

When the battery is charged or discharged, the voltage generally changes depending on the magnitude of the current value. For example, a voltage drop due to the resistance of the battery changes depending on the magnitude of the current value. Therefore, in some cases, the resistance of the battery can be calculated from the relationship between the voltage and the magnitude of the current value. The resistance value calculated in this manner may be used as an input parameter.

As an input parameter, the open circuit voltage (OCV, referred to as an open voltage in some cases) of the battery may be used. The open circuit voltage of the battery is, for example, a potential difference between the both ends of the battery in a state where no current flows therein. Here, the state where no current flows in the battery means, for example, a state where no load is applied to the battery and a state where a charge circuit is not electrically connected to the battery. The resistance of the battery can be calculated by comparing the open circuit voltage and the voltage in a state where a noticeable amount of current flows in the battery, in some cases.

The battery module of one embodiment of the present invention includes the control device including the neural network in which learning had been performed in advance, and the voltage, the current, the temperature, or the other measurement values of a battery in each battery unit are input to the control device by wireless communication. In the battery module, the data is input to the neural network to perform inference, whereby a battery regarded as having abnormal characteristics can be specified. Alternatively, optimal charging and discharging control can be performed in each battery unit by performing inference.

Structure examples of a neural network and a product-sum operation circuit that can be used for the battery module of one embodiment of the present invention will be described below with reference to drawings.

Figure 13A:
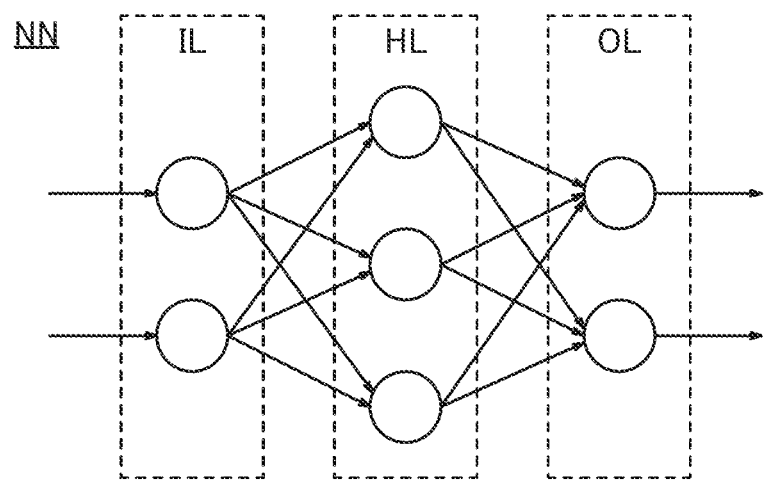
FIG. 13 A structure example of a neural network.

As illustrated in FIG. 13(A), the neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as DNN (deep neural network), and learning using a deep neural network can also be referred to as deep learning.

Input data is input to each neuron of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 13B:
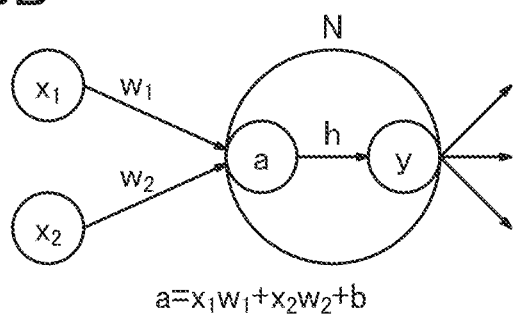

FIG. 13(B) illustrates an example of an operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal $y=h(a)$ is output from the neuron N.

In this manner, the operation with the neurons includes the operation that sums the products of the outputs and the weights of the neurons in the previous layer, that is, the product-sum operation ($x_1w_1+x_2w_2$ in the above). This product-sum operation may be performed using a program on software or by hardware. In the case where the product-sum operation is performed by hardware, a product-sum operation circuit can be used. A digital circuit may be used or an analog circuit may be used as this product-sum operation circuit. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit may be formed of a transistor including silicon (such as single crystal silicon) in a channel formation region (hereinafter also referred to as a Si transistor) or a transistor including an oxide semiconductor in a channel formation region (hereinafter referred to as an OS transistor). An OS transistor is particularly preferable as a transistor included in a memory of the product-sum operation circuit because of its extremely low off-state current. Note that the product-sum operation circuit may be formed using both a Si transistor and an OS transistor. A structure example of a semiconductor device having a function of the product-sum operation circuit will be described below.

[Structure Example of Semiconductor Device]

Figure 14:
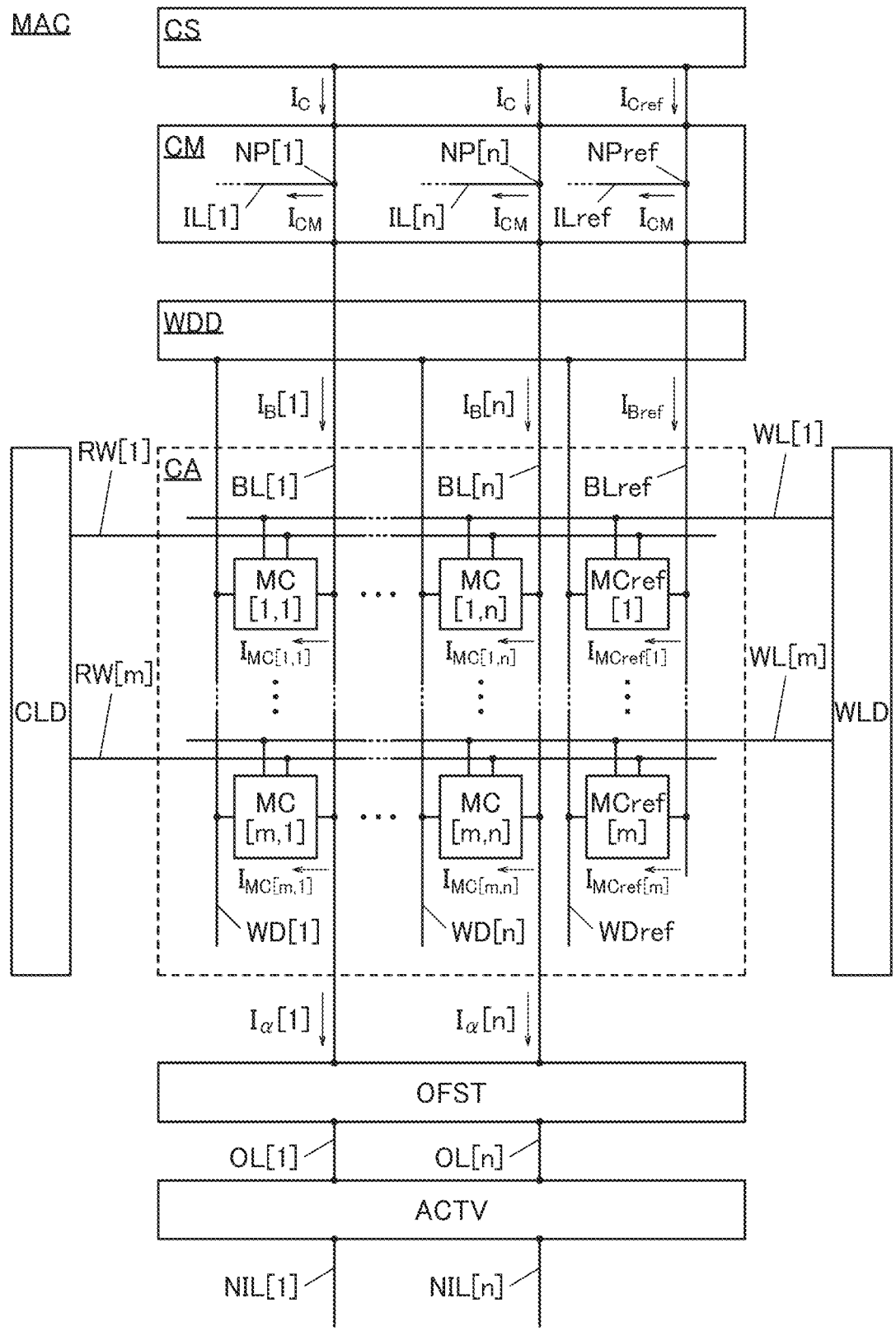
FIG. 14 A structure example of a semiconductor device.

FIG. 14 illustrates a structure example of a semiconductor device MAC having a function of performing an operation of the neural network. The semiconductor device MAC has a function of performing a product-sum operation of first data corresponding to the strength of connection (weight) between the neurons and second data corresponding to input data. Note that the first data and the second data can each be analog data or multilevel digital data (discrete data). The semiconductor device MAC also has a function of converting data obtained by the product-sum operation with the activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. In the structure example illustrated in FIG. 14, the cell array CA includes the memory cells MC in m rows and n columns (memory cells MC[1, 1] to MC[m, n]) and the m memory cells MCref (MCref[1] to MCref[m]) (m and n are integers greater than or equal to 1). The memory cells MC have a function of storing the first data. In addition, the memory cells MCref have a function of storing reference data used for the product-sum operation. Note that the reference data can be analog data or multilevel digital data.

The memory cell MC[i,j] is connected to a wiring WL[i], a wiring RW[i], a wiring WD[j], and a wiring BL[j] (i is an integer greater than or equal to 1 and less than or equal to m, and j is an integer greater than or equal to 1 and less than or equal to n). In addition, the memory cell MCref[i] is connected to the wiring WL[i], the wiring RW[i], a wiring WDref, and a wiring BLref. Here, a current flowing between the memory cell MC [i, j] and the wiring BL[j] is denoted by $I_{MC[i, j]}$, and a current flowing between the memory cell MCref[i] and the wiring BLref is denoted by $I_{MCref}[i]$.

Figure 15:
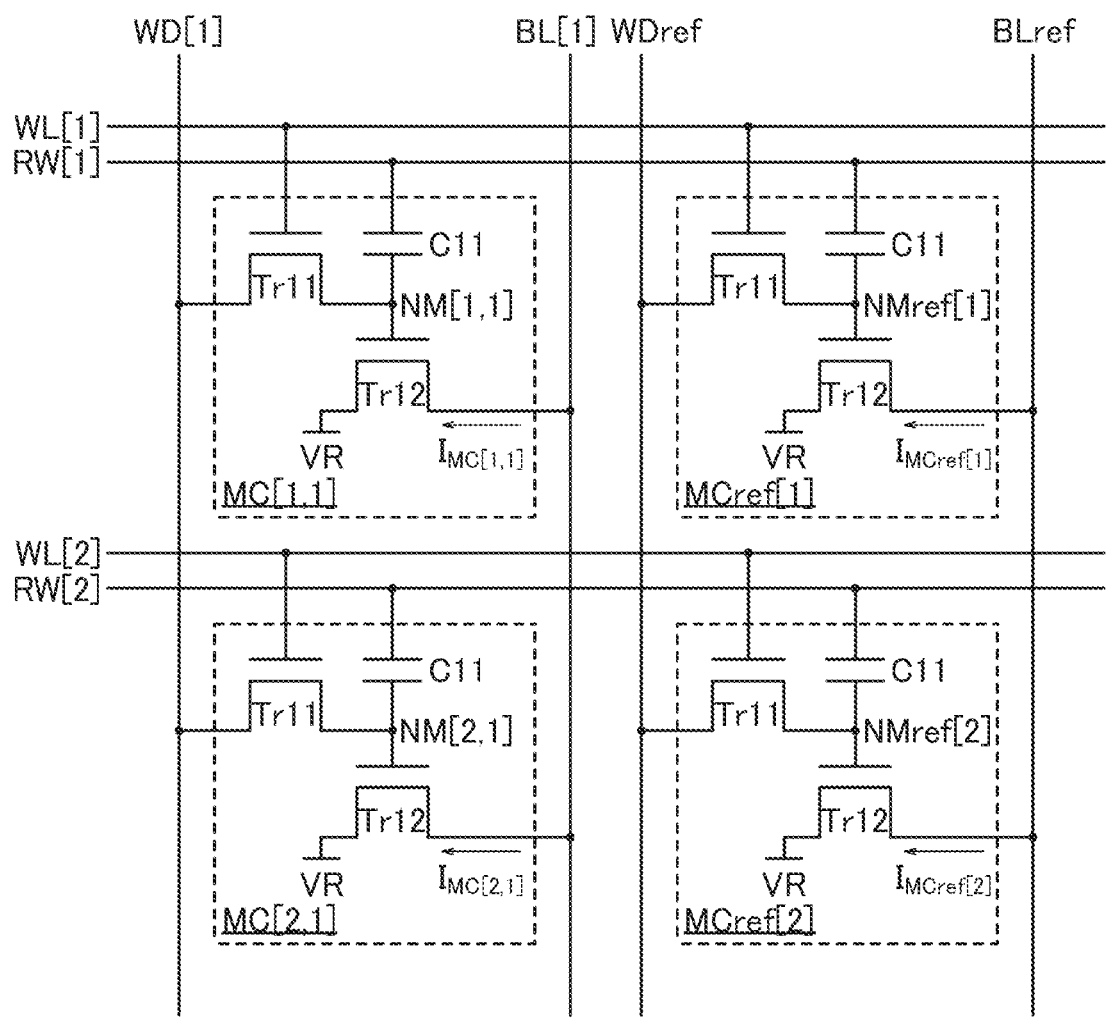
FIG. 15 A structure example of a memory cell.

FIG. 15 illustrates a specific structure example of the memory cell MC and the memory cell MCref. Although the memory cells MC[1, 1] and MC[2, 1] and the memory cells MCref[1] and MCref[2] are given as typical examples in FIG. 15, similar structures can also be used for other memory cells MC and other memory cells MCref. The memory cells MC and the memory cells MCref each include transistors Tr11 and Tr12 and a capacitor C11. Here, the case where the transistor Tr11 and the transistor Tr12 are n-channel transistors will be described.

In the memory cell MC, a gate of the transistor Tr11 is connected to the wiring WL, one of a source and a drain of the transistor Tr11 is connected to a gate of the transistor Tr12 and a first electrode of the capacitor C11, and the other of the source and the drain of the transistor Tr11 is connected to the wiring WD. One of a source and a drain of the transistor Tr12 is connected to the wiring BL, and the other of the source and the drain thereof is connected to a wiring VR. A second electrode of the capacitor C11 is connected to the wiring RW. The wiring VR has a function of supplying a predetermined potential. An example in which a low power source potential (e.g., a ground potential) is supplied from the wiring VR is described below.

Anode connected to the one of the source and the drain of the transistor Tr11, the gate of the transistor Tr12, and the first electrode of the capacitor C11 is referred to as a node NM. The nodes NM included in the memory cells MC[1, 1] and MC[2, 1] are referred to as nodes NM[1, 1] and NM[2, 1], respectively.

The memory cells MCref have a structure similar to that of the memory cell MC. However, the memory cells MCref are connected to the wiring WDref instead of the wiring WD and connected to a wiring BLref instead of the wiring BL. A node in the memory cell MCref[1] and a node in the memory cell MCref[2], each of which is connected to one of the source and the drain of the transistor Tr11, the gate of the transistor Tr12, and the first electrode of the capacitor C11, are referred to as a node NMref[1] and a node NMref[2], respectively.

The node NM and the node NMref function as holding nodes of the memory cell MC and the memory cell MCref, respectively. The first data is held in the node NM and the reference data is held in the node NMref. Furthermore, currents $I_{MC[1, 1]}$ and $I_{MC[2, 1]}$ flow from the wiring BL[1] to the transistors Tr12 of the memory cells MC[1, 1] and MC[2, 1], respectively. Currents $I_{MCref[1]}$ and $I_{MCref[2]}$ flow from the wiring BLref to the transistors Tr12 of the memory cells MCref[1] and MCref[2], respectively.

Since the transistor Tr11 has a function of holding a potential of the node NM or the node NMref, the off-state current of the transistor Tr11 is preferably low. Thus, it is preferable to use an OS transistor, which has extremely low off-state current, as the transistor Tr11. This suppresses a change in the potential of the node NM or the node NMref, so that the operation accuracy can be increased. Furthermore, frequency of operations of refreshing the potential of the node NM or the node NMref can be low, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be fabricated with the same manufacturing apparatus as that for the transistor Tr11, and accordingly manufacturing cost can be reduced. Note that the transistor Tr12 may be of either an n-channel type or a p-channel type.

The current source circuit CS is connected to the wirings BL[1] to BL[n] and the wiring BLref. The current source circuit CS has a function of supplying currents to the wirings BL[1] to BL[n] and the wiring BLref. Note that the value of the current supplied to the wirings BL[1] to BL[n] may be different from that of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref. Here, a connection portion between the wirings IL[1] and BL[1] to a connection portion between the wirings IL[n] and BL[n] are referred to as nodes NP[1] to NP[n], respectively. Furthermore, a connection portion between the wiring ILref and the wiring BLref is referred to as a node NPref.

The current mirror circuit CM has a function of flowing a current $I_{CM}$ corresponding to the potential of the node NPref to the wiring ILref and a function of flowing this current $I_{CM}$ also to the wirings IL[1] to IL[n]. In the example illustrated in FIG. 14, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by $I_B[1]$ to $I_B[n]$, respectively. Furthermore, a current flowing from the current mirror circuit CM to the cell array CA through the wiring BLref is denoted by $I_{Bref}$.

The circuit WDD is connected to wirings WD[1] to WD[n] and the wiring WDref. The circuit WDD has a function of supplying a potential corresponding to the first data stored in the memory cells MC to the wirings WD[1] to WD[n]. The circuit WDD also has a function of supplying a potential corresponding to the reference data stored in the memory cell MCref to the wiring WDref. The circuit WLD is connected to wirings WL[1] to WL[m]. The circuit WLD has a function of supplying a signal for selecting the memory cell MC or MCref to which data is to be written to any of the wirings WL[1] to WL[m]. The circuit CLD is connected to the wirings RW[1] to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of sensing the amount of currents flowing from the wirings BL[1] to BL[n] to the offset circuit OFST and/or the amount of a change in the currents flowing from the wirings BL[1] to BL[n] to the offset circuit OFST. The offset circuit OFST also has a function of outputting a sensing result to the wirings OL[1] to OL[n]. Note that the offset circuit OFST may output a current corresponding to the sensing result to the wiring OL, or may convert the current corresponding to the sensing result into a voltage to output the voltage to the wiring OL. The currents flowing between the cell array CA and the offset circuit OFST are denoted by $I_\alpha[1]$ to $I_\alpha[n]$.

Figure 16:
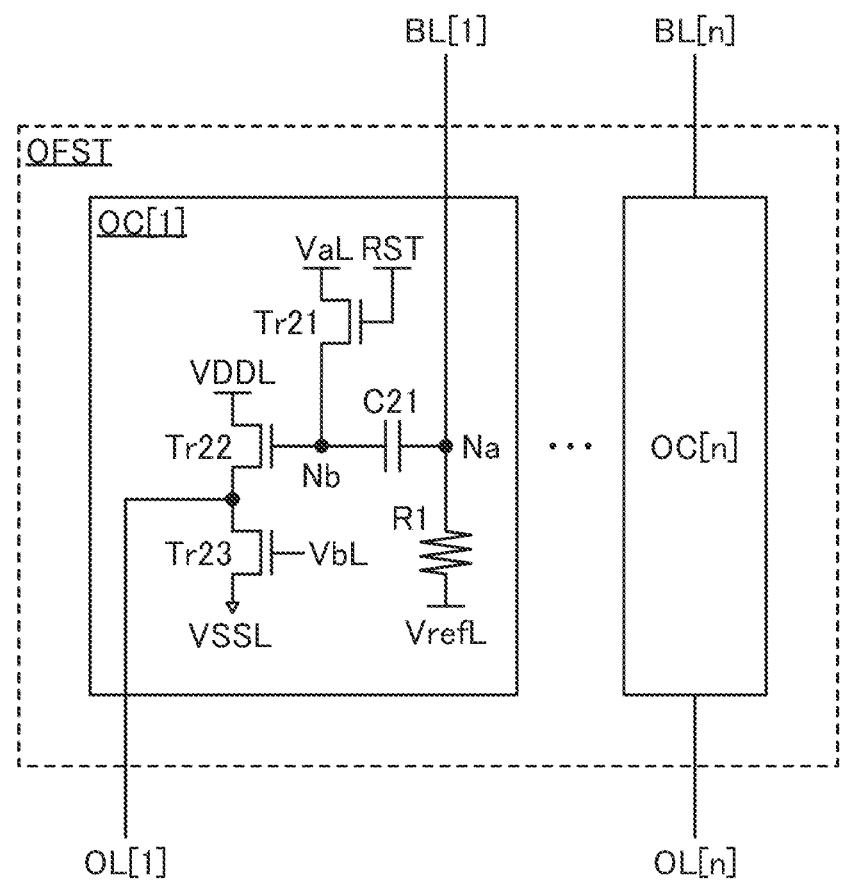
FIG. 16 A structure example of an offset circuit.

FIG. 16 illustrates a structure example of the offset circuit OFST. The offset circuit OFST illustrated in FIG. 16 includes circuits OC[1] to OC[n]. Furthermore, the circuits OC[1] to OC[n] each include a transistor Tr21, a transistor Tr22, a transistor Tr23, a capacitor C21, and a resistor R1. Connection relations of the elements are as illustrated in FIG. 16. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. Furthermore, a wiring VDDL has a function of supplying a potential VDD, and a wiring VSSL has a function of supplying a potential VSS. Here, the case where the potential VDD is a high power supply potential and the potential VSS is a low power supply potential is described. Furthermore, a wiring RST has a function of supplying a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] is described. Note that although an operation example of the circuit OC[1] is described here as a typical example, the circuits OC[2] to OC[n] can be operated in a similar manner. First, when a first current flows to the wiring BL[1], the potential of the node Na becomes a potential corresponding to the first current and the resistance value of the resistor R1. At this time, the transistor Tr21 is brought into an on state, and thus the potential Va is supplied to the node Nb. Then, the transistor Tr21 is brought into an off state.

Next, when a second current flows to the wiring BL[1], the potential of the node Na becomes a potential corresponding to the second current and the resistance value of the resistor R1. At this time, since the transistor Tr21 is in an off state and the node Nb is in a floating state, the potential of the node Nb is changed owing to capacitive coupling, following the change in the potential of the node Na. Here, when the amount of change in the potential of the node Na is $\Delta V_{Na}$ and the capacitive coupling coefficient is 1, the potential of the node Nb is $Va+\Delta V_{Na}$. In addition, when the threshold voltage of the transistor Tr22 is Vth, a potential of $Va+\Delta V_{Na}-V_{th}$ is output from the wiring OL[1]. Here, when $Va=V_{th}$, the potential $\Delta V_{Na}$ can be output from the wiring OL[1].

The potential $\Delta V_{Na}$ is determined by the amount of change from the first current to the second current, the resistor R1, and the potential Vref. Here, since the resistor R1 and the potential Vref are known, the amount of change in the current flowing to the wiring BL can be found from the potential $\Delta V_{Na}$.

A signal corresponding to the amount of current and/or the amount of change in the current sensed by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV has a function of performing an operation for converting the signal input from the offset circuit OFST in accordance with the activation function defined in advance. As the activation function, for example, a sigmoid function, a tan h function, a softmax function, a ReLU function, a threshold function, or the like can be used. The signal converted by the activation function circuit ACTV is output as output data to the wirings NIL[1] to NIL[n]

<Operation Example of Semiconductor Device>

With the above semiconductor device MAC, the product-sum operation of the first data and the second data can be performed. An operation example of the semiconductor device MAC at the time of performing the product-sum operation is described below.

Figure 17:
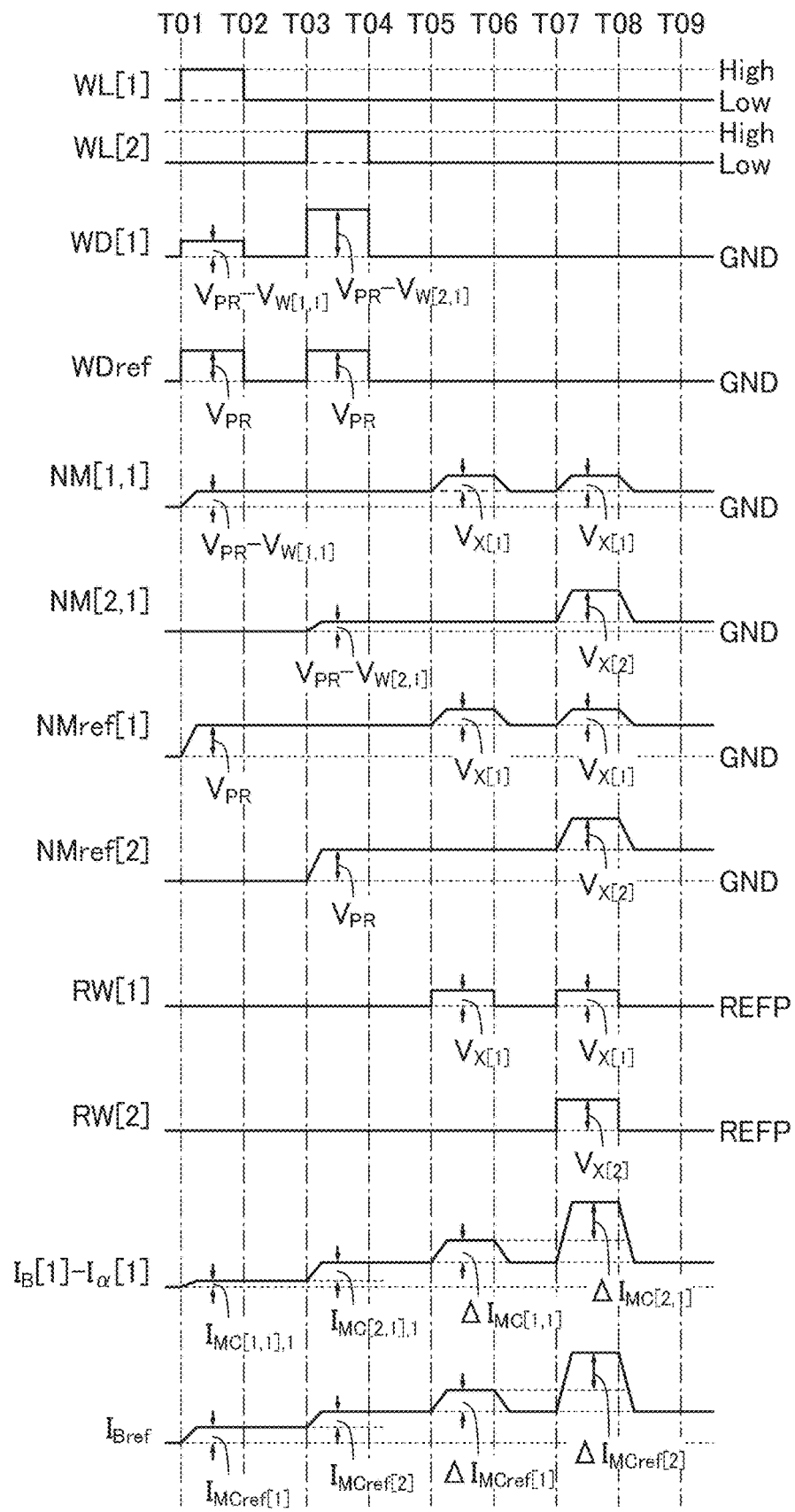
FIG. 17 A timing chart
FIG. 18 Examples of vehicles.

FIG. 17 is a timing chart showing the operation example of the semiconductor device MAC. FIG. 17 shows changes in the potentials of the wiring WL[1], the wiring WL[2], the wiring WD[1], the wiring WDref, the node NM[1, 1], the node NM[2, 1], the node NMref[1], the node NMref[2], the wiring RW[1], and the wiring RW[2] in FIG. 15 and changes in the values of the currents $I_B[1]-I_\alpha[1]$ and $I_{Bref}$. The currents $I_B[1]-I_\alpha[1]$ correspond to the sum total of the currents flowing from the wiring BL[1] to the memory cells MC[1, 1] and MC[2, 1].

No that although an operation is described with a focus on the memory cells MC[1, 1] and MC[2, 1] and the memory cells MCref[1] and MCref[2] illustrated in FIG. 15 as typical examples, the other memory cells MC and other memory cells MCref can also be operated in a similar manner.

[Storage of First Data]

First, during a period from Times T01 to T02, the potential of the wiring WL[1] becomes a high level, the potential of the wiring WD[1] becomes a potential greater than a ground potential (GND) by $V_{PR}-V_{W[1, 1]}$, and the potential of the wiring WDref becomes a potential greater than the ground potential by $V_{PR}$. Furthermore, the potentials of the wiring RW[1] and the wiring RW[2] are reference potentials (REFP). Note that the potential $V_{W[1, 1]}$ is the potential corresponding to the first data stored in the memory cell MC[1, 1]. In addition, the potential $V_{PR}$ is the potential corresponding to the reference data. Thus, the transistors Tr11 included in the memory cell MC[1, 1] and the memory cell MCref[1] are turned on, and the potentials of the node NM[1, 1] and the node NMref[1] become $V_{PR}-V_{W[1, 1]}$ and $V_{PR}$, respectively.

In this case, a current $I_{MC[1,1],0}$ flowing from the wiring BL[1] to the transistor Tr12 in the memory cell MC[1, 1] can be expressed by a formula shown below. Here, k is a constant determined by the channel length, the channel width, the mobility, the capacitance of a gate insulating film, and the like of the transistor Tr12. Furthermore, $V_{th}$ is a threshold voltage of the transistor Tr12.

$$I_{MC[1,1],0}=k(V_{PR}-V_{W[1,1]}-V_{th})^2 \tag{E1}$$

Furthermore, a current $I_{MCref[1], 0}$ flowing from the wiring BLref to the transistor Tr12 in the memory cell MCref[1] can be expressed by a formula shown below.

$$I_{MCref[1],0}=k(V_{PR}-V_{th})^2 \tag{E2}$$

Next, during a period from Times T02 to T03, the potential of the wiring WL[1] becomes a low level. Consequently, the transistors Tr11 included in the memory cell MC[1, 1] and the memory cell MCref[1] are turned off, and the potentials of the node NM[1, 1] and the node NMref[1] are held.

As described above, an OS transistor is preferably used as the transistor Tr11. This can suppress the leakage current of the transistor Tr11, so that the potentials of the node NM[1, 1] and the node NMref[1] can be accurately held.

Next, during a period from Times T03 to T04, the potential of the wiring WL[2] becomes the high level, the potential of the wiring WD[1] becomes a potential greater than the ground potential by $V_{PR}-V_{W[2, 1]}$, and the potential of the wiring WDref becomes a potential greater than the ground potential by $V_{PR}$. Note that the potential $V_{W[2, 1]}$ is a potential corresponding to the first data stored in the memory cell MC[2, 1]. Thus, the transistors Tr11 included in the memory cell MC[2, 1] and the memory cell MCref[2] are brought into an on state, and the potentials of the node NM[2, 1] and the node NMref[2] become $V_{PR}-V_{W[2, 1]}$ and $V_{PR}$, respectively.

Here, a current $I_{MC[2, 1], 0}$ flowing from the wiring BL[1] to the transistor Tr12 in the memory cell MC[2, 1] can be expressed by a formula shown below.

$$I_{MC[2,1],0}=k(V_{PR}-V_{W[2,1]}-V_{th})^2 \tag{E3}$$

Furthermore, a current $I_{MCref[2], 0}$ flowing from the wiring BLref to the transistor Tr12 in the memory cell MCref[2] can be expressed by a formula shown below.

$$I_{MCref[2],0}=k(V_{PR}-V_{th})^2 \tag{E4}$$

Next, during a period from Times T04 to T05, the potential of the wiring WL[2] becomes the low level. Consequently, the transistors Tr11 included in the memory cell MC[2, 1] and the memory cell MCref[2] are brought into an off state, and the potentials of the node NM[2, 1] and the node NMref[2] are held.

Through the above operation, the first data is stored in the memory cells MC[1, 1] and MC[2, 1], and the reference data is stored in the memory cells MCref[1] and MCref[2].

Here, currents flowing to the wiring BL[1] and the wiring BLref during the period from Times T04 to T05 are considered. The current is supplied from the current source circuit CS to the wiring BLref. The current flowing through the wiring BLref is also discharged to the current mirror circuit CM and the memory cells MCref[1] and MCref[2]. A formula shown below holds where $I_{Cref}$ is the current supplied from the current source circuit CS to the wiring BLref and $I_{CM, 0}$ is the current discharged from the wiring BLref to the current mirror circuit CM.

$$I_{Cref}-I_{CM,0}=I_{MCref[1],0}+I_{MCref[2],0} \tag{E5}$$

The current from the current source circuit CS is supplied to the wiring BL[1]. The current flowing through the wiring BL[1] is also discharged to the current mirror circuit CM and the memory cells MC[1, 1] and MC[2, 1]. Furthermore, the current flows from the wiring BL[1] to the offset circuit OFST. A formula shown below holds where $I_{C, 0}$ is the current supplied from the current source circuit CS to the wiring BL[1] and $I_{\alpha, 0}$ is the current flowing from the wiring BL[1] to the offset circuit OFST.

$$I_C-I_{CM,0}=I_{MC[1,1],0}+I_{MC[2,1],0}+I_{\alpha,0} \tag{E6}$$

[Product-Sum Operation of First Data and Second Data]

Next, during a period from Times T05 to T06, the potential of the wiring RW[1] becomes a potential greater than the reference potential by $V_{X[1]}$. At this time, the potential $V_{X[1]}$ is supplied to the capacitors C11 in the memory cells MC[1, 1] and the memory cell MCref[1], so that the potentials of the gates of the transistors Tr12 increase owing to capacitive coupling. Note that the potential $V_{X[1]}$ is the potential corresponding to the second data supplied to the memory cell MC[1, 1] and the memory cell MCref[1].

The amount of change in the potential of the gate of the transistor Tr12 corresponds to the value obtained by multiplying the amount of change in the potential of the wiring RW by a capacitive coupling coefficient determined by the memory cell structure. The capacitive coupling coefficient is calculated on the basis of the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is set to 1. In practice, the potential $V_X$ can be determined in consideration of the capacitive coupling coefficient.

When the potential $V_{X[1]}$ is supplied to the capacitors C11 in the memory cell MC[1,1] and the memory cell MCref[1], the potentials of the node NM[1,1] and the node NMref[1] each increase by $V_{X[1]}$.

Here, a current $I_{MC[1, 1], 1}$ flowing from the wiring BL[1] to the transistor Tr12 in the memory cell MC[1, 1] during the period from Times T05 to T06 can be expressed by a formula shown below.

$$I_{MC[1,1],1}=k(V_{PR}-V_{W[1,1]}+V_{X[1]}-V_{th})^2 \tag{E7}$$

Thus, when the potential $V_{X[1]}$ is supplied to the wiring RW[1], the current flowing from the wiring BL[1] to the transistor Tr12 in the memory cell MC[1, 1] increases by $\Delta I_{MC[1,1]}=I_{MC[1, 1],1}-I_{MC[1,1], 0}$.

In addition, a current $I_{MCref[1],1}$ flowing from the wiring BLref to the transistor Tr12 in the memory cell MCref[1] during the period from Times T05 to T06 can be expressed by a formula shown below.

$$I_{MCref[1],1}=k(V_{PR}+V_{X[1]}-V_{th})^2 \tag{E8}$$

Thus, when the potential $V_{X[1]}$ is supplied to the wiring RW[1], the current flowing from the wiring BLref to the transistor Tr12 in the memory cell MCref[1] increases by $\Delta I_{MCref[1]}=I_{MCref[1], 1}-I_{MCref[1], 0}$.

Furthermore, currents flowing to the wiring BL[1] and the wiring BLref are considered. A current $I_{Cref}$ is supplied from the current source circuit CS to the wiring BLref. The current flowing through the wiring BLref is also discharged to the current mirror circuit CM and the memory cells MCref[1] and MCref[2]. A formula shown below holds where $I_{CM,1}$ is the current discharged from the wiring BLref to the current mirror circuit CM.

$$I_{Cref} - I_{CM,1} = I_{MCref[1],1} + I_{MCref[2],1} \quad (E9)$$

The current $I_C$ from the current source circuit CS is supplied to the wiring BL[1]. The current flowing through the wiring BL[1] is also discharged to the current mirror circuit CM and the memory cells MC[1, 1] and MC[2, 1]. Furthermore, the current flows from the wiring BL[1] to the offset circuit OFST. A formula shown below holds where $I_{\alpha,1}$ is the current flowing from the wiring BL[1] to the offset circuit OFST.

$$I_C - I_{CM,1} = I_{MC[1,1],1} + I_{MC[2,1],1} + I_{\alpha,1} \quad (E10)$$

In addition, from Formula (E1) to Formula (E10), a difference between the current $I_{\alpha,0}$ and the current $I_{\alpha,1}$ (differential current $\Delta I_\alpha$) can be expressed by a formula shown below.

$$\Delta I_\alpha = I_{\alpha,1} - I_{\alpha,0} = 2k\, V_{W[1,1]} V_{X[1]} \quad (E11)$$

Thus, the differential current $\Delta I_\alpha$ is a value corresponding to the product of the potentials $V_{W[1, 1]}$ and $V_{X[1]}$.

After that, during a period from Times T06 to T07, the potential of the wiring RW[1] becomes the ground potential, and the potentials of the node NM[1, 1] and the node NMref[1] become similar to the potentials thereof during the period from Times T04 to T05.

Next, during a period from Times T07 to T08, the potential of the wiring RW[1] becomes the potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitors C11 in the memory cell MC[1, 1] and the memory cell MCref[1], and the potentials of the node NM[1, 1] and the node NMref[1] each increase by $V_{X[1]}$ due to capacitive coupling. Furthermore, the potential $V_{X[2]}$ is supplied to the capacitors C11 in the memory cell MC[2, 1] and the memory cell MCref[2], and the potentials of the node NM[2, 1] and the node NMref[2] each increase by $V_{X[2]}$ due to capacitive coupling.

Here, the current $I_{MC[2, 1], 1}$ flowing from the wiring BL[1] to the transistor Tr12 in the memory cell MC[2, 1] during the period from Times T07 to T08 can be expressed by a formula shown below.

$$I_{MC[2,1],1} = k(V_{PR} - V_{W[2,1]} + V_{X[2]} - V_{th})^2 \quad (E12)$$

Thus, when the potential $V_{X[2]}$ is supplied to the wiring RW[2], the current flowing from the wiring BL[1] to the transistor Tr12 in the memory cell MC[2, 1] increases by $\Delta I_{MC[2,1]} = I_{MC[2, 1],1} - I_{MC[2,1],0}$.

Here, a current $I_{MCref[2], 1}$ flowing from the wiring BLref to the transistor Tr12 in the memory cell MCref[2] during the period from Times T05 to T06 can be expressed by a formula shown below.

$$I_{MCref[2],1} = k(V_{PR} + V_{X[2]} - V_{th})^2 \quad (E13)$$

Thus, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing to the wiring BL[1] and the wiring BLref are considered. The current $I_{Cref}$ is supplied from the current source circuit CS to the wiring BLref. The current flowing through the wiring BLref is also discharged to the current mirror circuit CM and the memory cells MCref[1] and MCref[2]. A formula shown below holds where $I_{CM, 2}$ is the current discharged from the wiring BLref to the current mirror circuit CM.

$$I_{Cref} - I_{CM,2} = I_{MCref[1],1} + I_{MCref[2],1} \quad (E14)$$

The current $I_C$ from the current source circuit CS is supplied to the wiring BL[1]. The current flowing through the wiring BL[1] is also discharged to the current mirror circuit CM and the memory cells MC[1, 1] and MC[2, 1]. Furthermore, the current flows from the wiring BL[1] to the offset circuit OFST. A formula shown below holds where $I_{\alpha, 2}$ is the current flowing from the wiring BL[1] to the offset circuit OFST.

$$I_C - I_{CM,2} = I_{MC[1,1],1} + I_{MC[2,1],1} + I_{\alpha,2} \quad (E15)$$

In addition, from Formula (E1) to Formula (E8) and Formula (E12) to Formula (E15), a difference between the current $I_{\alpha, 0}$ and the current $I_{\alpha, 2}$ (differential current $\Delta I_\alpha$) can be expressed by a formula shown below.

$$\Delta I_\alpha = I_{\alpha,2} - I_{\alpha,0} = 2k(V_{W[1,1]} V_{X[1]} V_{W[2,1]} V_{X[2]}) \quad (E16)$$

Thus, the differential current $\Delta I_\alpha$ is a value corresponding to a result of the sum of the product of the potential $V_{W[1, 1]}$ and the potential $V_{X[1]}$ and the product of the potential $V_{W[2, 1]}$ and the potential $V_{X[2]}$.

After that, during a period from Times T08 to T09, the potentials of the wirings RW[1] and RW[2] become the ground potential, and the potentials of the nodes NM[1, 1] and NM[2, 1] and the nodes NMref[1] and NMref[2] become similar to the potentials thereof during the period from Times T04 to T05.

As represented by Formula (E9) and Formula (E16), the differential current $\Delta I_\alpha$ input to the offset circuit OFST is a value corresponding to a result of the sum of the products of the potentials $V_X$ corresponding to the first data (weight) and the potentials $V_W$ corresponding to the second data (input data). Thus, measurement of the differential current $\Delta I_\alpha$ with the offset circuit OFST gives the result of the product-sum operation of the first data and the second data.

Note that although the memory cells MC[1, 1] and MC[2, 1] and the memory cells MCref[1] and MCref[2] are focused on in the above description, the number of the memory cells MC and MCref can be set freely. The differential current $\Delta I_\alpha$ can be expressed by a formula shown below in the case where the number m of rows of the memory cell MC and the memory cell MCref is a given number.

$$\Delta I_\alpha = 2k \Sigma_i V_{W[i,1]} V_{X[i]} \quad (E17)$$

Furthermore, when the number n of columns of the memory cell MC and the memory cell MCref is increased, the number of product-sum operations executed in parallel can be increased.

The product-sum operation of the first data and the second data can be performed using the semiconductor device MAC as described above. Note that the use of the structure of the memory cell MC and the memory cell MCref in FIG. 15 allows the product-sum operation circuit to be formed of a smaller number of transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 13(A) is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the structure of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), or the like.

The product-sum operation of the neural network can be performed using the semiconductor device MAC as described above. Furthermore, the memory cell MC and the memory cell MCref illustrated in FIG. 15 are used for the cell array CA, which can provide an integrated circuit IC with improved operation accuracy, lower power consumption, or a reduced circuit scale.

At least part of this embodiment can be implemented in combination with any of the other embodiments described in this specification as appropriate.

Embodiment 3

In this embodiment, an example of a vehicle equipped with the battery module which is one embodiment of the present invention will be described. Examples of vehicles are automobiles, motorcycles, bicycles, and the like.

The use of battery modules in vehicles enables production of next-generation clean energy vehicles such as hybrid electric vehicles (HEVs), electric vehicles (EVs), and plug-in hybrid electric vehicles (PHEVs).

Figure 18A:
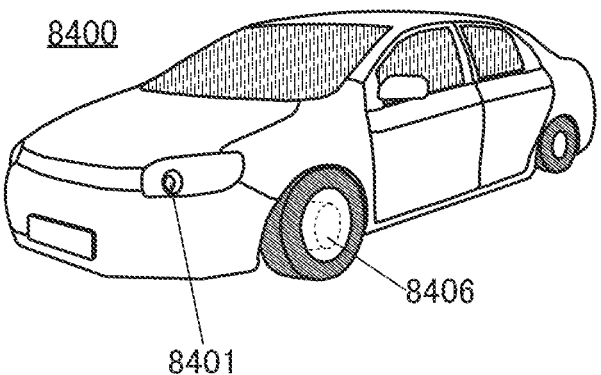

FIG. 18 illustrates examples of a vehicle using the battery module which is one embodiment of the present invention. An automobile 8400 illustrated in FIG. 18(A) is an electric vehicle that runs on an electric motor as a power source. Alternatively, the automobile 8400 is a hybrid electric vehicle capable of driving appropriately using either an electric motor or an engine. The use of one embodiment of the present invention can achieve a high-mileage vehicle. The automobile 8400 includes the battery module. The battery module is capable of suppling electric power to a light-emitting device such as a headlight 8401 or a room light (not illustrated) as well as driving an electric motor 8406.

The battery module can also supply electric power to a display device of a speedometer, a tachometer, or the like included in the automobile 8400. Furthermore, the battery module can supply electric power to a navigation system or the like included in the automobile 8400.

Figure 18B:
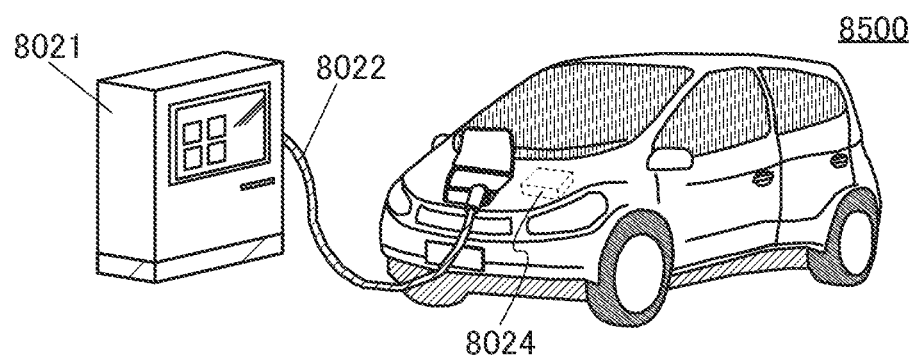

An automobile 8500 illustrated in FIG. 18(B) can be charged when the battery module included in the automobile 8500 is supplied with electric power from external charging equipment by a plug-in system, a contactless power feeding system, or the like. FIG. 18 (B) illustrates the state in which a battery module 8024 included in the automobile 8500 is charged with a ground-based charging apparatus 8021 through a cable 8022. In charging, a given method such as CHAdeMO (registered trademark) or Combined Charging System may be employed as a charging method, the standard of a connector, or the like as appropriate. The charging apparatus 8021 may be a charging station provided in a commerce facility or a power source in a house. With the use of a plug-in technique, the battery module 8024 included in the automobile 8500 can be charged by being supplied with electric power from the outside, for example. The charging can be performed by converting AC electric power into DC electric power through a converter, such as an AC-DC converter.

Although not illustrated, the vehicle may include a power receiving device so that it can be charged by being supplied with electric power from an above-ground power transmitting device in a contactless manner. In the case of the contactless power feeding system, by fitting a power transmitting device in a road or an exterior wall, charging can be performed not only when the electric vehicle is stopped but also when driven. In addition, the contactless power feeding system may be utilized to perform transmission and reception of electric power between vehicles. A solar cell may be provided in the exterior of the vehicle to charge the battery module when the vehicle stops or moves. To supply electric power in such a contactless manner, an electromagnetic induction method or a magnetic resonance method can be used.

Figure 18C:
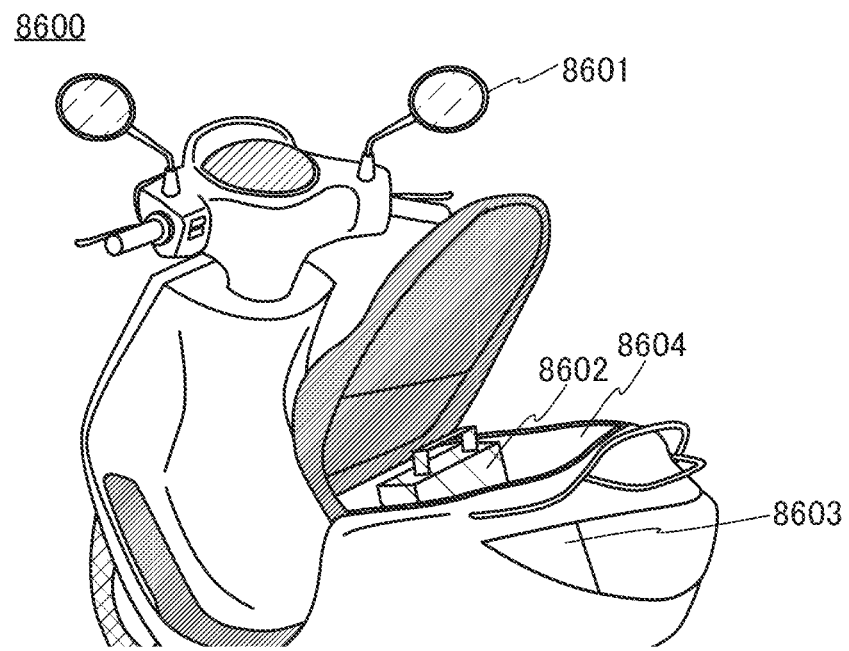

FIG. 18(C) is an example of a two-wheeled vehicle using the battery module of one embodiment of the present invention. A motor scooter 8600 illustrated in FIG. 18(C) includes a battery module 8602, side mirrors 8601, and indicator lights 8603. The battery module 8602 can supply electricity to the indicator lights 8603.

In the motor scooter 8600 illustrated in FIG. 18(C), the battery module 8602 can be stored in a storage unit under seat 8604. The battery module 8602 can be stored in the storage unit under seat 8604 even with a small size.

Figure 19A:
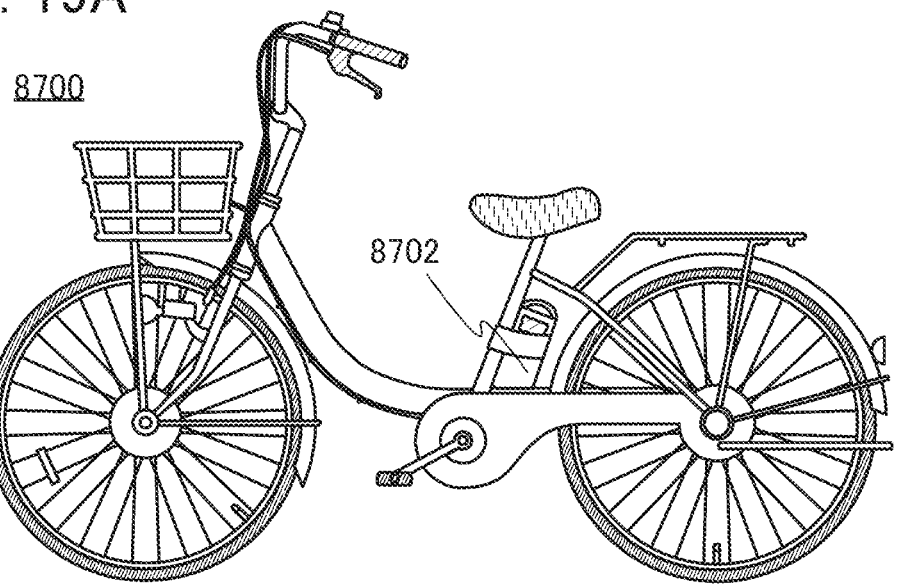
FIG. 19 Examples of vehicles.

FIG. 19(A) is an example of an electric bicycle using the battery module of one embodiment of the present invention. The battery module of one embodiment of the present invention can be used for an electric bicycle 8700 illustrated in FIG. 19(A).

Figure 19B:
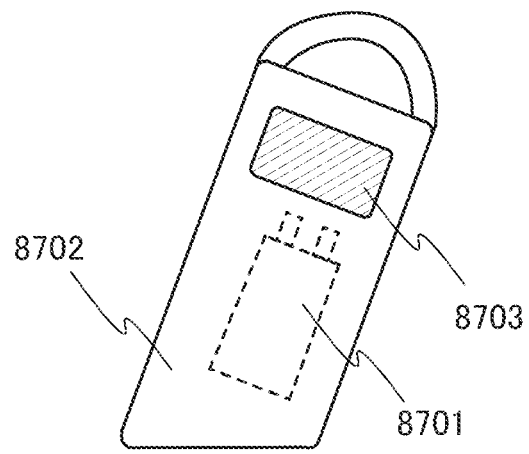

The electric bicycle 8700 is provided with a battery pack 8702. The battery pack 8702 can supply electricity to a motor that assists a rider. The battery pack 8702 is portable, and FIG. 19(B) illustrates the state where the battery pack 8702 is detached from the bicycle. A plurality of storage batteries 8701 included in the battery module of one embodiment of the present invention are incorporated in the battery pack 8702, and the remaining battery capacity and the like can be displayed on a display portion 8703. The battery pack 8702 preferably includes a protection circuit, a neural network, and the like.

Figure 19C:
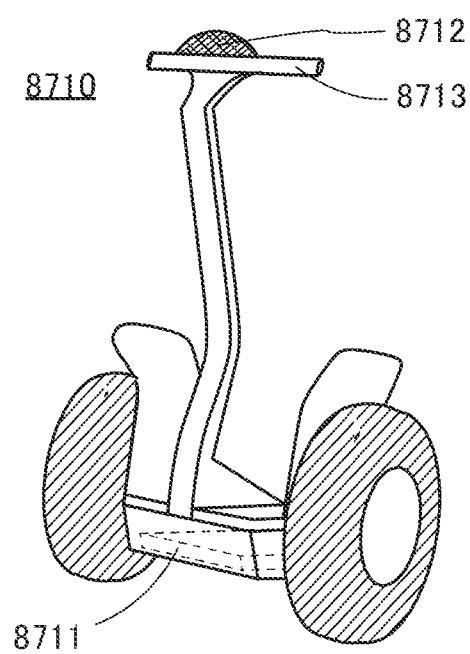

FIG. 19(C) is an electric motorcycle 8710 using the battery module of one embodiment of the present invention. The battery module of one embodiment of the present invention can be used for the electric motorcycle 8710 in FIG. 19(C).

The electric motorcycle 8710 includes a storage battery 8711, a display portion 8712, and a steering wheel 8713. The storage battery 8711 can supply electricity to a motor serving as a power source. The display portion 8712 can display the remaining battery level of the storage battery 8711, the velocity and the horizontal state of the electric motorcycle 8710, and the like. The storage battery 8711 preferably includes a protection circuit, a neural network, and the like.

This embodiment can be combined with the description of the other embodiments as appropriate.

Embodiment 4

In this embodiment, an example in which the battery module described in the above embodiment is mounted on an electronic device will be described.

Figure 20A:
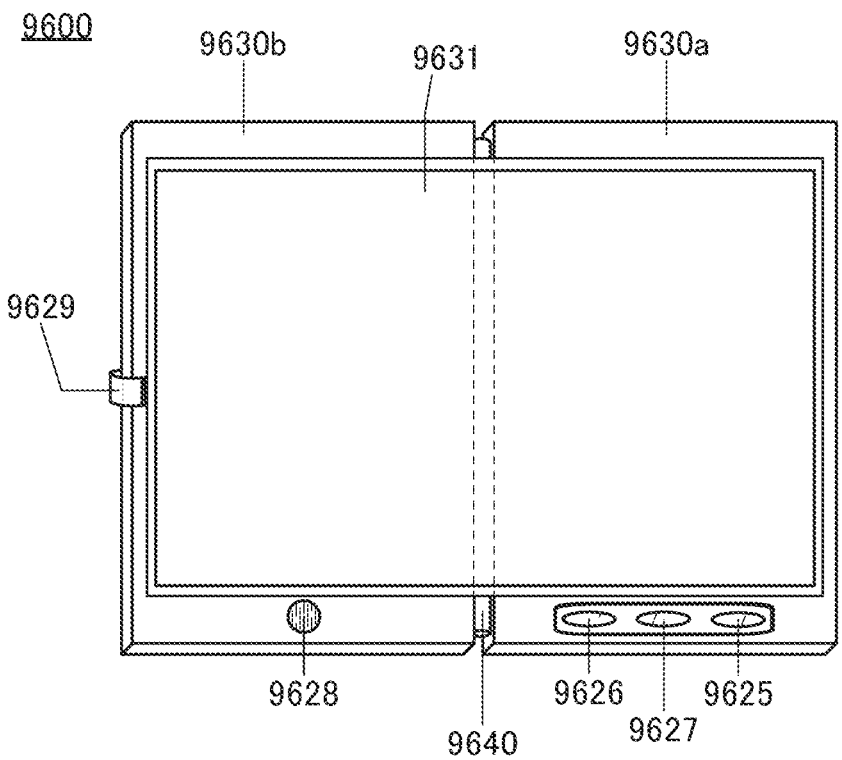
FIG. 20 An example of an electronic device.
Figure 20B:
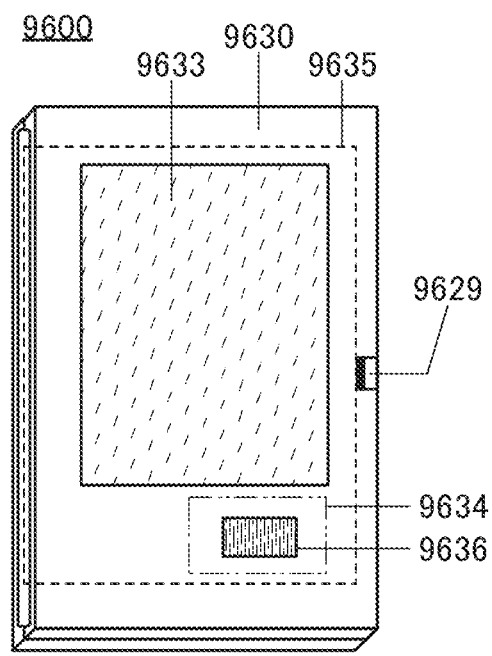

FIG. 20(A) and FIG. 20(B) illustrate an example of a foldable tablet terminal. A tablet terminal 9600 illustrated in FIG. 20(A) and FIG. 20(B) includes a housing 9630a, a housing 9630b, a movable portion 9640 connecting the housing 9630a and the housing 9630b, a display portion 9631, a display mode changing switch 9626, a power switch 9627, a power saving mode changing switch 9625, a fastener 9629, and an operation switch 9628. A flexible panel is used for the display portion 9631, whereby a tablet terminal with a larger display portion can be provided. FIG. 20(A) illustrates the tablet terminal 9600 that is opened, and FIG. 20(B) illustrates the tablet terminal 9600 that is closed.

The tablet terminal 9600 includes a power storage unit 9635 inside the housing 9630a and the housing 9630b. The power storage unit 9635 is provided across the housing 9630a and the housing 9630b, passing through the movable portion 9640.

Part of the display portion 9631 can be a touch panel region and data can be input when a displayed operation key is touched. When a position where a keyboard display switching button is displayed on the touch panel is touched with a finger, a stylus, or the like, keyboard buttons can be displayed on the display portion 9631.

The display mode changing switch 9626 can switch the display orientation between vertical display, horizontal display, and the like, and between monochrome display and color display, for example. With the power-saving-mode changing switch 9625, the luminance of display can be optimized depending on the amount of external light at the time when the tablet terminal 9600 is in use, which is sensed with an optical sensor incorporated in the tablet terminal. In addition to the optical sensor, another sensing device such as a sensor for sensing inclination, e.g., a gyroscope sensor or an acceleration sensor, may be incorporated in the tablet terminal.

The tablet terminal is closed in FIG. 20(B). The tablet terminal includes the housing 9630, a solar cell 9633, and a charge and discharge control circuit 9634 including a DC-DC converter 9636. The battery module of one embodiment of the present invention can be used as the power storage unit 9635.

As described in the above embodiments, the battery module of one embodiment of the present invention preferably includes a storage battery, a protection circuit, a control circuit, and a neural network. The integrated circuits such as the control circuit, the neural network, and the protection circuit in the battery module of one embodiment of the present invention may be mounted on an IC chip with a circuit that controls the display portion 9631, such as a driver circuit, for example. Alternatively, the integrated circuits may be mounted on an IC chip with the charge and discharge control circuit 9634.

The tablet terminal 9600 can be folded such that the housing 9630a and the housing 9630b overlap with each other when not in use. Thus, the display portion 9631 can be protected, which increases the durability of the tablet terminal 9600.

The tablet terminal illustrated in FIGS. 20(A) and 20(B) can also have a function of displaying various kinds of data (e.g., a still image, a moving image, and a text image), a function of displaying a calendar, a date, or the time on the display portion, a touch-input function of operating or editing data displayed on the display portion by touch input, a function of controlling processing by various kinds of software (programs), and the like.

The solar cell 9633, which is attached on the surface of the tablet terminal, can supply electric power to the touch panel, the display portion, a video signal processing portion, and the like. Note that the solar cell 9633 can be provided on one or both surfaces of the housing 9630 and the power storage unit 9635 can be charged efficiently.

Figure 20C:
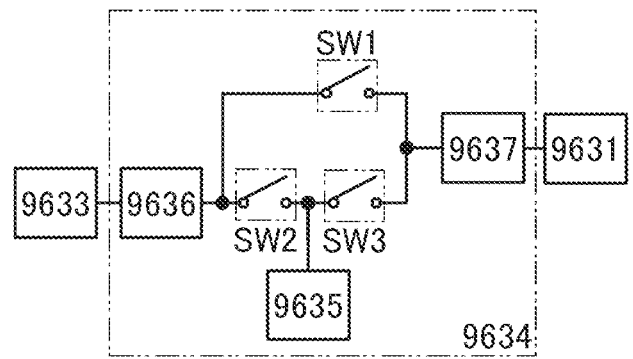

The structure and operation of the charge and discharge control circuit 9634 illustrated in FIG. 20(B) will be described with reference to a block diagram in FIG. 20(C). The solar cell 9633, the power storage unit 9635, the DC-DC converter 9636, a converter 9637, switches SW1 to SW3, and the display portion 9631 are illustrated in FIG. 20(C), and the power storage unit 9635, the DC-DC converter 9636, the converter 9637, and the switches SW1 to SW3 correspond to the charge and discharge control circuit 9634 in FIG. 20(B).

First, an example of the operation in the case where power is generated by the solar cell 9633 using external light will be described. The voltage of electric power generated by the solar cell is raised or lowered by the DC-DC converter 9636 to a voltage for charging the power storage unit 9635. When the power from the solar cell 9633 is used for the operation of the display portion 9631, the switch SW1 is turned on and the voltage of the power is raised or lowered by the converter 9637 to a voltage needed for operating the display portion 9631. When display on the display portion 9631 is not performed, SW1 is turned off and SW2 is turned on, so that the power storage unit 9635 can be charged.

Note that the solar cell 9633 is described as an example of a power generation means; however, one embodiment of the present invention is not limited to this example. The power storage unit 9635 may be charged using another power generation means such as a piezoelectric element or a thermoelectric conversion element (Peltier element). For example, the power storage unit 9635 may be charged with a non-contact power transmission module that transmits and receives power wirelessly (without contact) to charge the battery or with a combination of other charging means.

Figure 21A:
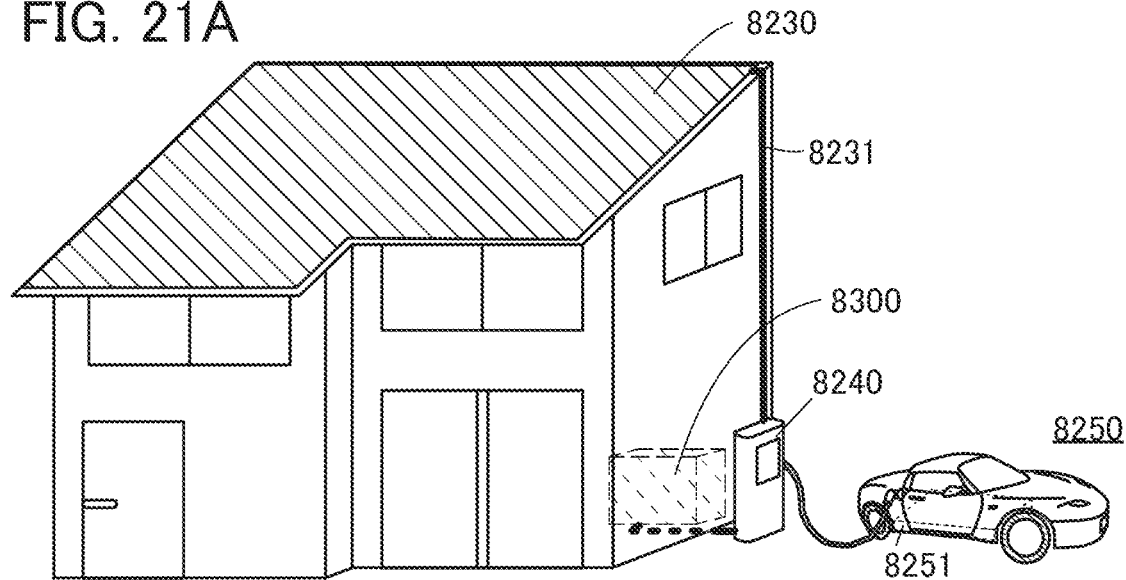
FIG. 21 Application examples of a battery module.
Figure 21B:
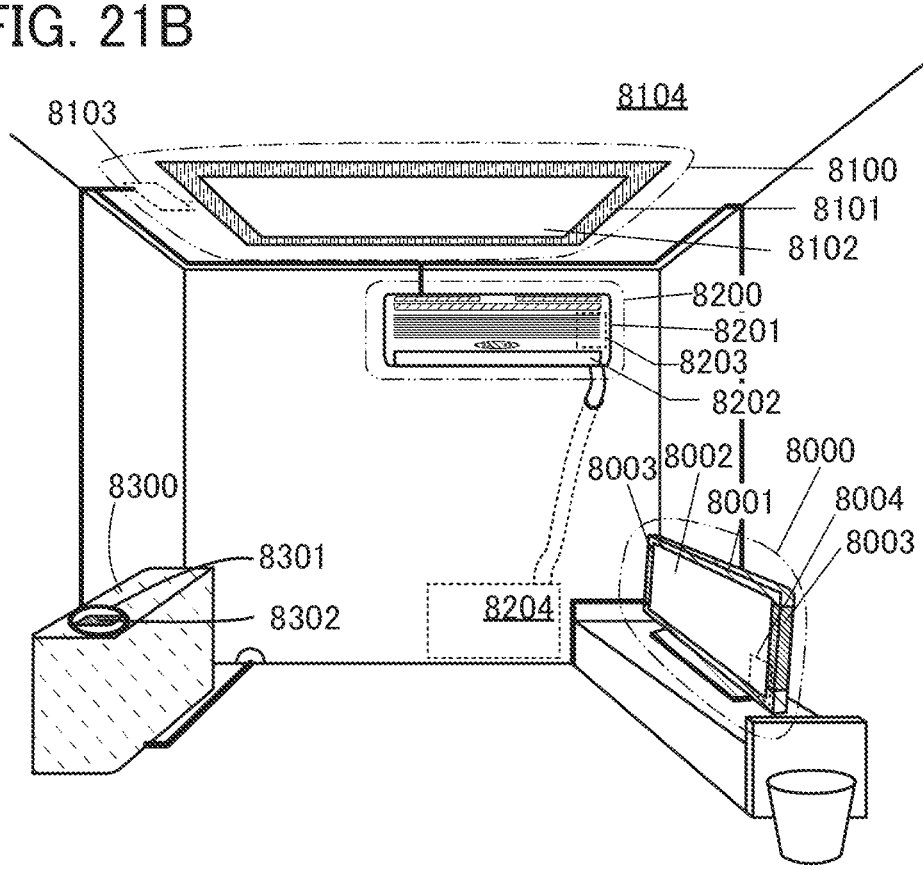

FIGS. 21(A) and 21(B) illustrate other examples of the battery module and an electronic device. FIG. 21(A) illustrates an example of a house including a battery module 8300 which is one embodiment of the present invention and a solar panel 8230. The house is preferably equipped with a ground-based charging apparatus 8240. The battery module 8300 preferably includes a protection circuit, a control circuit, and a neural network.

The battery module 8300, the solar panel 8230, and the charging apparatus 8240 are electrically connected to each other through a wiring 8231 and the like. The battery module 8300 can be charged with the electric power generated by the solar panel 8230. A storage battery 8251 included in an automobile 8250 can be charged with the electric power stored in the battery module 8300. Note that the automobile 8250 is an electric car or a plug-in hybrid car.

The electric power stored in the battery module 8300 can also be supplied to other electronic devices. For example, as illustrated in FIG. 21(B), the battery module 8300 is electrically connected to an installation lighting device 8100, and the electric power can be supplied to the lighting device 8100. The lighting device 8100 includes a housing 8101, a light source 8102, a control circuit 8103, and the like. The lighting device 8100 can receive electric power from a commercial power supply. Alternatively, the lighting device 8100 can use electric power stored in the battery module 8300. Thus, the lighting device 8100 can operate with the use of the battery module 8300 of one embodiment of the present invention as an uninterruptible power supply even when electric power cannot be supplied from a commercial power supply due to power failure or the like.

The installation lighting device 8100 provided in a ceiling 8104 is illustrated in FIG. 21(B) as an example; however, the battery module 8300 of one embodiment of the present invention can supply electric power, for example, to an installation lighting device provided in a wall, a floor, a window, or the like other than the ceiling 8104. Alternatively, the battery module 8300 can supply electric power to a tabletop lighting device or the like.

As the light source 8102, an artificial light source which emits light artificially by using power can be used. Specifically, an incandescent lamp, a discharge lamp such as a fluorescent lamp, and a light-emitting element such as an LED or an organic EL element are given as examples of the artificial light source.

Similarly, the battery module 8300 can supply electric power to a display device 8000. The display device 8000 includes a housing 8001, a display portion 8002, a speaker portion 8003, a control circuit 8004, and the like. The display device 8000 can receive electric power from a commercial power supply. Alternatively, the display device 8000 can use electric power stored in the battery module 8300. A display device such as a liquid crystal display device, a light-emitting device in which a light-emitting element such as an organic EL element is provided in each pixel, an electrophoretic display device, a digital micromirror device (DMD), a plasma display panel (PDP), or a field emission display (FED) can be used for the display portion 8002.

Note that the display device includes, in its category, all of information display devices for personal computers, advertisement displays, and the like other than TV broadcast reception.

Similarly, the battery module 8300 can supply electric power to an air conditioner including an indoor unit 8200 and an outdoor unit 8204. Specifically, the indoor unit 8200 includes a housing 8201, an air outlet 8202, a control circuit 8203, and the like. The air conditioner can receive electric power from a commercial power supply. Alternatively, the air conditioner can use electric power stored in the battery module 8300.

Note that although the split-type air conditioner including the indoor unit and the outdoor unit is illustrated in FIG. 21(B) as an example, electric power may be supplied from the battery module of one embodiment of the present invention to an air conditioner having the functions of an indoor unit and an outdoor unit in one housing.

In addition, the battery module 8300 preferably includes a charging apparatus 8301. When the charging apparatus 8301 is included, a variety of electronic devices can be charged from the battery module 8300. The charging apparatus 8301 may be a charging apparatus for wired charging or for wireless charging (also referred to as non-contact charging or wireless power transmission). When the battery module 8300 includes a wireless charging apparatus, a smartphone 8302 or the like provided with a wireless charging system can be charged.

FIGS. 22(A) to 22(F) illustrate examples of an electronic device including the battery module of one embodiment of the present invention. Examples of electronic devices to which the battery module of one embodiment of the present invention is applied are television sets (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, and large game machines such as pachinko machines, and the like.

Figure 22A:
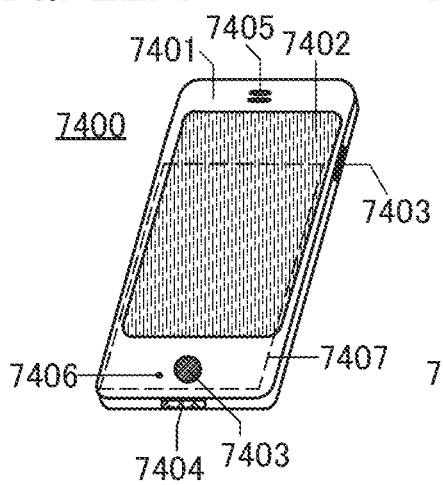
FIG. 22 Examples of electronic devices.

FIG. 22(A) illustrates an example of a mobile phone. A mobile phone 7400 is provided with an operation button 7403, an external connection port 7404, a speaker 7405, a microphone 7406, and the like in addition to a display portion 7402 incorporated in a housing 7401. The mobile phone 7400 includes the battery module of one embodiment of the present invention. The battery module of one embodiment of the present invention includes a storage battery 7407, a protection circuit, a control circuit, and a neural network, for example.

Figure 22B:
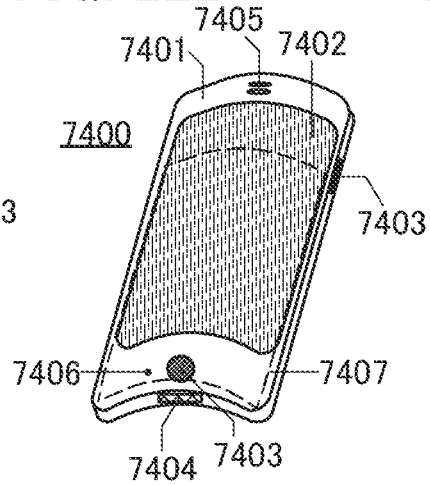
Figure 22C:
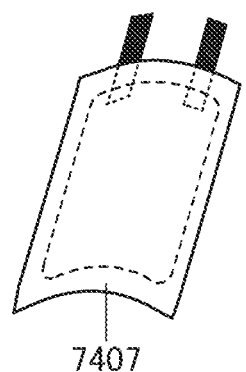

FIG. 22(B) illustrates the state where the mobile phone 7400 is curved. When the mobile phone 7400 is entirely curved by external force, the storage battery 7407 provided therein may also be curved. In such a case, a storage battery having flexibility is preferably used as the storage battery 7407. FIG. 22(C) illustrates the state where the storage battery having flexibility is curved.

A storage battery having a flexible shape can also be incorporated along a curved inside/outside wall surface of a house or a building or a curved interior/exterior surface of an automobile.

Figure 22D:
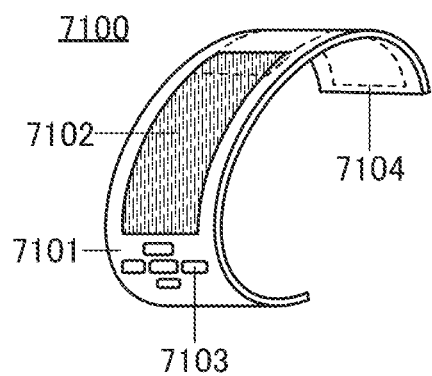

FIG. 22(D) illustrates an example of a bangle-type display device. A portable display device 7100 includes a housing 7101, a display portion 7102, an operation button 7103, and the battery module of one embodiment of the present invention. The battery module of one embodiment of the present invention includes a storage battery 7104, a protection circuit, a control circuit, and a neural network, for example.

Figure 22E:
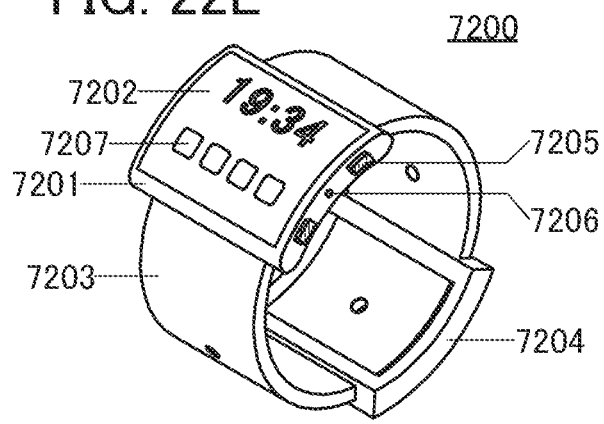

FIG. 22(E) illustrates an example of a watch-type portable information terminal. A portable information terminal 7200 includes a housing 7201, a display portion 7202, a band 7203, a buckle 7204, an operation button 7205, an input output terminal 7206, and the like.

The portable information terminal 7200 is capable of executing a variety of applications such as mobile phone calls, e-mailing, viewing and editing texts, music reproduction, Internet communication, and a computer game.

The display portion 7202 is provided such that its display surface is curved, and display can be performed along the curved display surface. The display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as time setting, power on/off, on/off of wireless communication, setting and cancellation of a silent mode, and setting and cancellation of a power saving mode can be performed. For example, the functions of the operation button 7205 can be set freely by setting the operation system incorporated in the portable information terminal 7200.

The portable information terminal 7200 can employ near field communication that is a communication method based on an existing communication standard. For example, mutual communication between the portable information terminal and a headset capable of wireless communication can be performed, and thus hands-free calling is possible.

The portable information terminal 7200 includes the input output terminal 7206, and data can be directly transmitted to and received from another information terminal via a connector. In addition, charging via the input output terminal 7206 is possible. The charging operation may be performed by wireless power feeding without using the input output terminal 7206.

The portable information terminal 7200 includes the battery module of one embodiment of the present invention.

The portable information terminal 7200 preferably includes a sensor. As the sensor, for example, a human body sensor such as a fingerprint sensor, a pulse sensor, or a temperature sensor, a touch sensor, a pressure sensitive sensor, an acceleration sensor, or the like is preferably mounted.

Figure 22F:
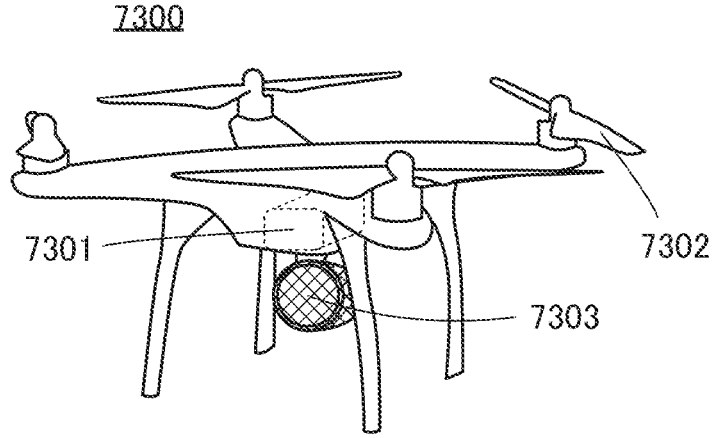

FIG. 22(F) illustrates an unmanned aircraft 7300 including a plurality of rotors 7302. The unmanned aircraft 7300 includes a power storage system 7301 of one embodiment of the present invention, a camera 7303, and an antenna (not illustrated). The unmanned aircraft 7300 can be remotely controlled through the antenna.

At least part of this embodiment can be implemented in combination with any of the other embodiments described in this specification as appropriate.

REFERENCE NUMERALS

10: semiconductor device, 10*a-d*: semiconductor device, 11: substrate, 12: element layer, 13*a-b*: terminal, 14: antenna, 15: connection portion, 16: protective layer, 17: substrate, 20: battery unit, 20*a-b*: battery unit, 20*p*: battery unit, 20M: battery module, 21*a-b*: exterior body, 22: printed circuit board, 23: IC, 24: antenna, 25: connector wiring, 26: conductive member, 26*n*: conductive member, 26*p*: conductive member, 27*n*: wiring, 27*p*: wiring, 30: battery, 30*a-d*: battery, 31*n*: negative electrode terminal, 31*p*: positive electrode terminal, 33: lead, 34: conductive member, 35: exterior body, 36*n*: connection terminal, 36*p*: connection terminal, 40: control device, 41: control portion, 42: wireless communication portion, 43: antenna, 50: circuit, 51: voltage sensing circuit, 52: current sensing circuit, 53: temperature sensor, 54: balance circuit, 55*a-c*: A-D converter circuit, 60: circuit, 61: control portion, 62: wireless communication portion, 63: antenna, 71: support substrate, 72: separation layer, 80*a-b*: transistor, 81: semiconductor layer, 82: insulating layer, 83: conductive layer, 84*a-c*: conductive layer, 85: conductive layer, 85*a*: conductive layer, 85*f*: conductive film, 86: insulating layer, 88: conductive layer, 89: conductive layer, 90-93: insulating layer.

The invention claimed is:

1. A semiconductor device comprising:
a first substrate;
an element layer;
a first conductive layer;
a second conductive layer; and
a third conductive layer,
wherein the element layer comprises a first circuit and a second circuit and is provided on a side of a first surface of the first substrate
wherein the first conductive layer and the second conductive layer are each provided on a side of a second surface positioned opposite to the first surface of the first substrate,
wherein the first circuit is electrically connected to each of the first conductive layer and the second conductive layer through an opening provided in the first substrate,
wherein the third conductive layer is provided to be stacked on a side opposite to the first substrate side of the element layer and electrically connected to the second circuit,
wherein the first conductive layer and the second conductive layer each function as a terminal, and
wherein the third conductive layer functions as an antenna.

2. The semiconductor device according to claim 1,
wherein the second circuit has a function of performing wireless communication via the third conductive layer.

3. The semiconductor device according to claim 1,
wherein the first circuit has at least one of a function of sensing a voltage between the first conductive layer and the second conductive layer, a function of sensing a current flowing between the first conductive layer and the second conductive layer, and a function of sensing a temperature.

4. The semiconductor device according to claim 1, wherein the first substrate has flexibility.

5. The semiconductor device according to claim 1,
wherein a second substrate facing the first substrate is included between the element layer and the third conductive layer therebetween, and
wherein the second substrate has flexibility.

6. A battery unit comprising the semiconductor device according to claim 1 and a battery,
wherein the first conductive layer of the semiconductor device is in contact with a positive electrode terminal of the battery, and the second conductive layer is in contact with a negative electrode terminal of the battery.

7. A battery unit comprising:
the semiconductor device according to claim 1; and
a plurality of batteries;
wherein the plurality of batteries are connected in series, and
wherein the first conductive layer of the semiconductor device is electrically connected to a positive electrode terminal or a negative electrode terminal of one of the batteries, and the second conductive layer is electrically connected to a positive electrode terminal or a negative electrode terminal of another of the batteries.

8. The battery unit according to claim 7,
wherein each of the plurality of batteries is a cylindrical battery, and
wherein the first conductive layer and the second conductive layer of the semiconductor device are provided in contact with side surfaces of cylindrical exterior bodies of the respective batteries.

9. A battery module comprising:
the plurality of battery units according to claim 6;
a control device; and
an exterior body,
wherein the plurality of battery units and the control device are provided in the exterior body,
wherein the control device comprises an antenna, a wireless communication portion, and a control portion, and
wherein the control portion has a function of performing wireless communication with the plurality of battery units via the wireless communication portion and the antenna.

10. The battery module according to claim 9, wherein the control portion comprises a neural network.

* * * * *